(12) United States Patent
Suzuki et al.

(10) Patent No.: US 6,809,348 B1
(45) Date of Patent: Oct. 26, 2004

(54) SEMICONDUCTOR DEVICE AND METHOD FOR MANUFACTURING THE SAME

(75) Inventors: Mikimasa Suzuki, Toyohashi (JP); Akira Kuroyanagi, Okazaki (JP); Takeshi Miyajima, Anjo (JP); Shoji Miura, Nukata-gun (JP); Yutaka Tomatsu, Okazaki (JP); Fuminari Suzuki, Kasugai (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/675,209

(22) Filed: Sep. 29, 2000

(30) Foreign Application Priority Data

| Oct. 8, 1999 | (JP) | 11-288250 |
| Nov. 9, 1999 | (JP) | 11-318232 |
| Nov. 9, 1999 | (JP) | 11-318233 |
| Apr. 6, 2000 | (JP) | 2000-104796 |

(51) Int. Cl.[7] .................. H01L 29/74; H01L 31/111
(52) U.S. Cl. ................................................. 257/119
(58) Field of Search ................ 257/202, 262, 257/369, 566, 574, 577, 584, 587, 602, 173, 174, 139, 140, 328, 331, 332, 378, 278

(56) References Cited

U.S. PATENT DOCUMENTS

| 4,631,569 A | * | 12/1986 | Calhoun | 357/45 |
| 5,079,608 A | * | 1/1992 | Wodarczyk et al. | 357/23.13 |
| 5,391,895 A | * | 2/1995 | Dreifus | 257/77 |
| 5,644,148 A | * | 7/1997 | Kinzer | 257/133 |
| 5,696,396 A | * | 12/1997 | Tokura et al. | 257/341 |
| 5,751,024 A | * | 5/1998 | Takahashi | 257/139 |
| 5,793,065 A | * | 8/1998 | Shinohe et al. | 257/147 |
| 5,915,179 A | * | 6/1999 | Etou et al. | 438/268 |
| 6,160,305 A | * | 12/2000 | Sanchez | 257/565 |
| 6,180,966 B1 | * | 1/2001 | Kohno et al. | 257/173 |
| 6,329,692 B1 | * | 12/2001 | Smith | 257/360 |
| 6,339,191 B1 | * | 1/2002 | Crane, Jr. et al. | 174/52.4 |
| 6,504,763 B1 | * | 1/2003 | Yang et al. | 365/185.28 |

FOREIGN PATENT DOCUMENTS

| JP | A-54-104286 | 8/1979 |
| JP | 363062384 A | * 3/1988 |
| JP | A-6-85268 | 3/1994 |
| JP | A-6-291223 | 10/1994 |
| JP | A-6-291324 | 10/1994 |
| JP | A-7-288325 | 10/1995 |
| JP | 8-191145 | 7/1996 |
| JP | 2000-91485 | 3/2000 |

\* cited by examiner

*Primary Examiner*—Long Pham
*Assistant Examiner*—Dana Farahani
(74) *Attorney, Agent, or Firm*—Posz & Bethards, PLC

(57) ABSTRACT

A semiconductor device has a semiconductor substrate, several cell blocks provided on the semiconductor substrate, several gate electrodes electrically independent of one another and respectively provided in the cell blocks, and several gate pads respectively connected with the gate electrodes. In this construction, the cell blocks can be determined whether they are defective or not by utilizing the gate pads easily. Therefore, the semiconductor device can be operated only with non-defective cell blocks.

34 Claims, 23 Drawing Sheets

SEMICONDUCTOR DEVICE AND METHOD FOR MANUFACTURING THE SAME

CROSS REFERENCE TO RELATED APPLICATIONS

This application is based upon and claims the benefit of Japanese Patent Applications No. 11-288250 filed on Oct. 8, 1999, No. 11-318232 filed on Nov. 9, 1999, No. 11-318233 filed on Nov. 9, 1999, and No. 2000-104796 filed on Apr. 6, 2000, the contents of which are incorporated herein by reference.

BACKGROUND OF THE INVENTION

1. Field of the Invention

The present invention relates to a semiconductor device and an insulated gate type bipolar transistor, having a current controlling gate electrode over a surface of a semiconductor substrate.

2. Description of the Related Art

In a power element such as an IGBT (Insulated Gate Bipolar Transistor) for a high withstand voltage and a large current, if a chip size is enlarged, a ratio of an area occupied by a withstand voltage structure (e.g., a guard ring structure), which is provided in the outer periphery of the chip, can be reduced. Further, the number of parts can be reduced to provide effects that the assembly structure can be simplified and that the cost can be reduced.

In a semiconductor wafer process for manufacturing the IGBT, on the other hand, defects may be produced by particles, for example, to cause short-circuit between an emitter and a gate. As the chip size is increased, this disadvantage becomes more liable to occur to cause a problem that a rate of non-defective products decreases.

As a technique for solving this problem, JP-A-8-191145 discloses a method for manufacturing an IGBT. In this method, the IGBT is divided into several cell blocks (gate blocks) and a wiring lead leading from each of the gate blocks to a gate bonding pad common to the gate blocks is formed with a two-layered wiring structure. In the course of the semiconductor wafer process, i.e., after first gate wiring members are formed for the respective gate blocks, the several cell blocks are determined on whether a gate and an emitter are short-circuited, i.e., those qualities (properties) are determined. After this, an intermediate insulating film is formed.

According to the quality determination, via holes formed in the intermediate insulating film for the cell blocks are filled with polyimide solution dropped therein by a dispenser or the like. Accordingly, two-layered wiring members are provided to connect only the first gate wiring members of the non-defective cell blocks with the second layer gate wiring member and isolating the first gate wiring member of the defective cell block from the second gate wiring member to short the same to source electrodes. According to this method, even when the cell blocks includes some defective blocks, the IGBT can be composed of the non-defective cell blocks exclusively and can be normally operated. As a result, the rate of non-defective products can be prevented from dropping.

According to the method described above, however, the several cell blocks are determined on their quality in the course of the semiconductor wafer process, and then the multi-layered wiring structure must be formed for connecting the non-defective cell blocks exclusively with the gate bonding pad. Therefore, the process is very complicated. In addition, it is practically difficult (as the Publication fails to disclose the specific method) to decide the qualities of the cell blocks in the course of the semiconductor wafer process.

SUMMARY OF THE INVENTION

The present invention has been made in view of the above problems. An object of the present invention is to provide a semiconductor device and an insulated gate bipolar transistor that can prevent a rate of non-defective products from decreasing and be manufactured by a simple semiconductor wafer process even when the chip size of the semiconductor device is enlarged.

According to the present invention, briefly, a semiconductor device is composed of a semiconductor substrate, a plurality of cell blocks provided on the semiconductor substrate, a plurality of gate electrodes electrically independent of one another and respectively provided in the cell blocks, and a plurality of gate pads provided on the semiconductor substrate and respectively connected with the gate electrodes.

According to this construction, each of the cell blocks can be determined on whether it is defective or not readily by utilizing the gate pads. Then, only gate pads of non-defective cell blocks can be connected with a gate terminal provided outside of the semiconductor substrate. As a result, even when the semiconductor device includes a defective cell block, the semiconductor device can be operated normally, and a rate of non-defective products is prevented from dropping even when a chip size is enlarged. Incidentally, the gate pad of the defective cell block can be connected with one of a ground potential, an emitter pad, and a source pad.

Preferably, a plurality of marks are provided on the semiconductor substrate for discriminating whether the cell blocks are defective. Accordingly, the discrimination of whether the cell blocks are defective becomes easy. The semiconductor device can have a pad having an emitter potential, and the gate pad of the defective cell block can be connected with the pad. In this case, for example, a ground terminal needs not be provided outside of the semiconductor substrate by a lead frame or the like, resulting in size reduction and low manufacturing cost.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

Figure 1:
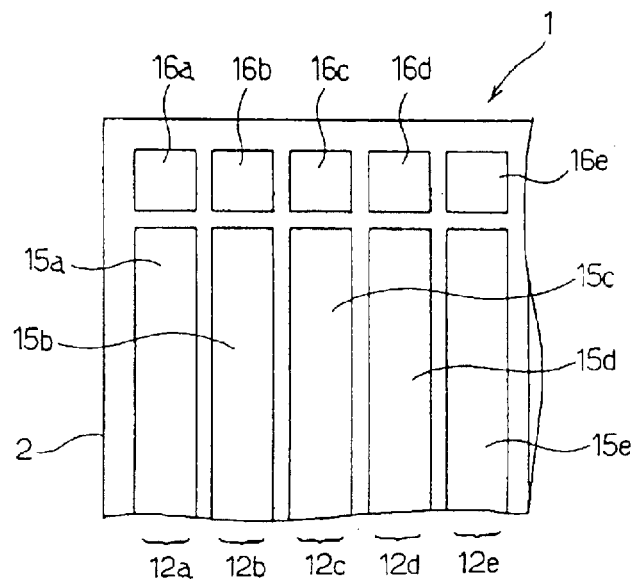
FIG. 1 is a plan view schematically showing a part of an IGBT in a first preferred embodiment.

A first preferred embodiment in which the present invention is applied to an IGBT (Insulated Gate Bipolar Transistor) will be described with reference to FIGS. 1 to 3. As shown in FIG. 2, the IGBT 1 of this embodiment is of trench gate type. This IGBT 1 is provided with a semiconductor substrate such as a $p^+$ substrate (a $p^+$ silicon substrate) 2, over which an $n^+$ buffer layer 3 and an $n^-$ drift layer 4 are sequentially formed by an epitaxial method.

A p base layer 5 is formed on the upper face of the $n^-$ drift layer 4. A number of trenches 6 are formed in this p base layer to pass through the p base layer 5 to the $n^-$ drift layer 4. Gate electrodes 8 are formed inside the trenches 6 through gate insulating films 7. The gate insulating films 7 are made of for example a silicon oxide film or an ONO film, and the gate electrodes 8 are made of for example polycrystalline silicon. High-concentration $n^+$ emitter layers 9 are selectively formed in the surface portions of the p base layer 5 contacting the upper portions of the trenches 6. Emitter electrodes 10 are formed on the p base layer 5 in contact with the p base layer 5 and the $n^+$ emitter layers 9. A collector electrode 11 is formed on the back face (lower face) of the $p^+$ substrate 2.

Figure 2:
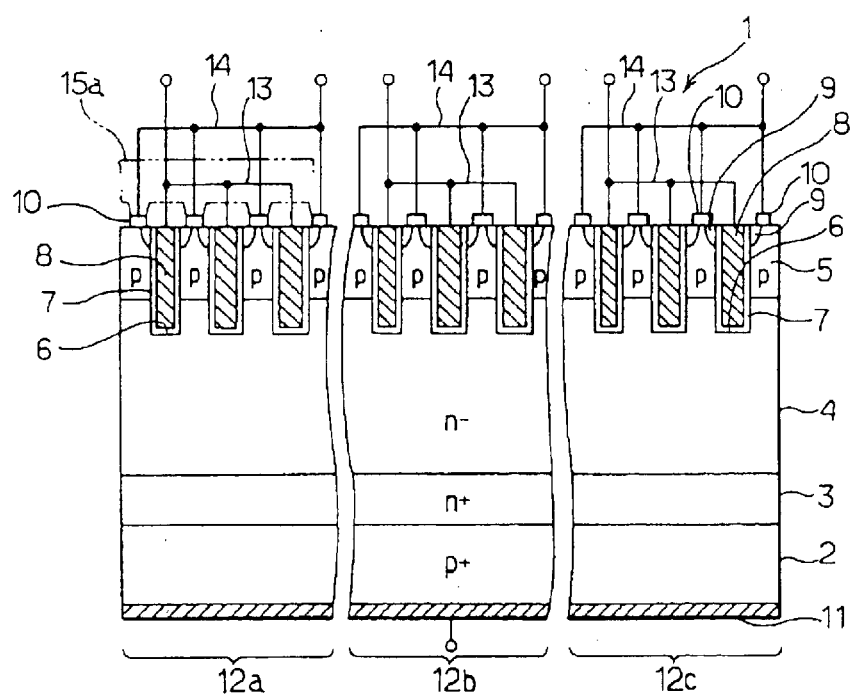
FIG. 2 is a cross-sectional view showing the IGBT in the first embodiment.

Here, as shown in FIG. 1, the surface of the chip (i.e., the semiconductor substrate 2) of the IGBT 1 thus constructed is divided into several (two or more) cell blocks 12 (12a, 12b, 12c, ...) as IGBT regions. That is, the cell blocks 12 are provided on the surface of the IGBT chip 1. The number of the cell blocks 12 varies in its preferable value depending on the size of the chip of the IGBT 1 and for example six in this embodiment; however, it is also preferable to be about ten to twenty.

The gate electrodes 8 formed in the respective cell blocks 12 (12a, 12b, 12c, ...) are made independent of (electrically isolated from) one another for each cell block. Here, the number of MOSFET cells formed in one cell block 12 (i.e., the number of the gate electrodes 8 or the trenches 6) varies with the cell pitch or the size of the cell area (the size of the cell block) but is about several hundreds to several thousands. This is because the cell pitch is generally about several μm and the size of the cell area is a square of about several mm. As shown in FIG. 2, all the gate electrodes 8 formed in one cell block 12 are connected with one another through a wiring layer 13. All the emitter electrodes 10 formed in the one cell block 12 are also connected with one another through a wiring layer 14, Referring back to FIG. 1, the chip of the IGBT 1 is formed into a generally rectangular plate shape and is provided, on its surface regions corresponding to the cell blocks 12 (12a, 12b, 12c, ... ), with several emitter pads 15 (15a, 15b, 15c, ... ) having generally the same shape as that of the cell blocks 12. On one side portion (the upper side portion in FIG. 1) of the chip surface of the IGBT 1, generally square gate pads 16 (16a, 16b, 16c, ... ) are arranged in a line.

Each of the emitter pads 15 (15a, 15b, 15c, ... ) is connected, as shown by double-dotted lines in FIG. 2, with the emitter electrodes 10 in each cell block 12 so that it has a function as the foregoing wiring layer 14. Also, each of the emitter pads provides electric conduction to the chip outside and in this embodiment is connected with an emitter terminal (not-shown) disposed at the chip outside, by wire bonding or soldering. When the chip of the IGBT 1 is to be mounted on for example a circuit board, the emitter terminal is composed of an electrode formed on the board for the emitter terminal. When the chip of the IGBT 1 is to be mounted on a lead frame, for example, the emitter terminal is composed of a lead formed with the lead frame for the emitter terminal.

On the other hand, each of the gate pads 16 (16a, 16b, 16c, ... ) is connected with the gate electrodes 8 in each cell block 12 through the aforementioned wiring layer 13. In this case, each wiring layer 13 is transversely taken out and is arranged along the longitudinal side portion of the emitter pads 15 in FIG. 1 (i.e., in the portion between the two emitter pads 15) and is connected with each gate pad 16.

Figure 3:
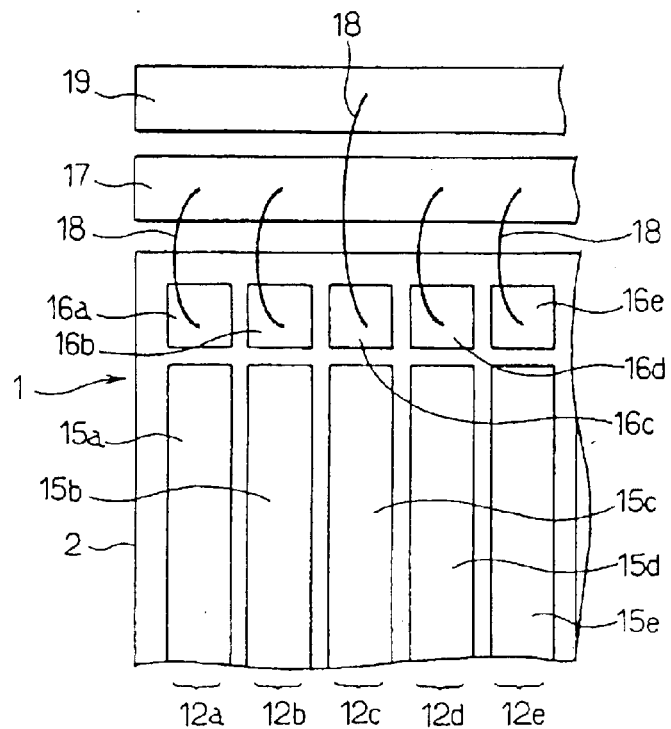
FIG. 3 is a plan view showing a state in which gate pads of the IGBT are connected with a gate terminal or a ground terminal by wire bonding in the first embodiment.

Further, each gate pad 16 provides electric conduction to the outside of the chip of the IGBT 1 and as shown in FIG. 3 is connected in the case of this embodiment with a gate terminal 17 disposed outside of the chip for example through a bonding wire 18. Here, the gate pads 16 connected with the gate terminal 17 are gate pads 16a, 16b, 16d and 16e connected with the gate electrodes 8 of the non-defective cell blocks 12. As a result, when a gate controlling signal is fed from the outside to the gate terminal 17, it is fed to the gate electrodes 8 of the non-defective cell blocks 12 so that elements in the non-defective cell blocks 12 are operated.

To the contrary, as shown in FIG. 3, the gate pad 16 (16c) connected with the gate electrode 18 of the defective cell block 12 is connected with a ground terminal 19 provided outside the chip through for example a bonding wire 18. As a result, the gate electrode 8 (or the gate pad 16c) of the defective cell block 12 is fixed at the ground potential (the GND potential). As a result, the gate controlling signal is not fed to the gate electrode 18of the defective cell block 12 so that elements in the defective cell block 12 are not operated.

When the chip of the IGBT 1 is to be mounted on the circuit board, the gate terminal 17 and the ground terminal 19 are composed of electrodes formed on the circuit board. When the chip of the IGBT 1 is to be mounted on a lead frame, the gate terminal 17 and the ground terminal 19 are composed of lead portions formed with the lead frame.

Here, the determination on whether the cell blocks 12 are on-defective or not is made before or after each chip is diced nd after the wafer process is finished, by employing a well-known test device that is for measuring a withstand voltage between the gate electrode and the emitter electrode. Specifically, after the steps of forming the emitter pads 15 and the gate pads 16 of the IGBT 1 are finished, that is, after the semiconductor wafer process is finished, testing needles of the test device are erected on (connected with) the emitter pad 15 and the gate pad 16 of the first cell block 12 to measure the withstand voltage between the gate electrodes 8 and the emitter electrodes 10.

At this time, if the withstand voltage is 20 V or more, the cell block 12 is determined to be a non-defective one. If otherwise (that is, if the withstand voltage is lower than 20 V), the cell block 12 is determined to be a defective one. Subsequently, the withstand voltages between the gate electrodes 8 and the emitter electrodes 10 are measured for the second and later cell blocks 12 substantially in the same manner.

After all the cell blocks 12 are determined on their qualities by measuring the withstand voltages between the gate electrodes 8 and the emitter electrodes 10, the gate pads 16 connected with the gate electrodes 8 of the non-defective cell blocks 12 are connected with the gate terminal 17 provided outside of the chip by wire bonding, while the gate pad 16 connected with the gate electrode 8 of the defective cell block 12 is connected with the ground terminal 19 provided outside of the chip by wire bonding. After that, the chip of the IGBT 1 thus constructed is assembled into a package to complete the manufacture of the IGBT 1.

In this embodiment thus constructed, the chip (the semiconductor substrate) of one IGBT 1 is provided over its surface with the several cell blocks 12, each of which is provided with the gate electrodes 8 independent of one another among the cell blocks 12. The chip of the IGBT 1 is further provided with the several gate pads 16 for bonding which are respectively connected with the gate electrodes 8 of the respective cell blocks 12. According to this construction, the several cell blocks 12 can be easily determined on their respective qualities by utilizing the several gate pads 16 and the well-known test device.

In the case of this construction, further, it becomes possible to connect only the gate pads 16 of the non-defective cell blocks 12 with the external gate terminal 17. Even when some of the cell blocks 12 are defective, the IGBT 1 (the semiconductor device) can be composed of the non-defective cell blocks 12 exclusively so that it can act normally. As a result, even when the chip size of the IGBT 1 is enlarged, the rate of non-defective products can be prevented from decreasing.

In addition, the aforementioned construction needs not to have a multi-layered wiring structure so that the number of steps of the semiconductor wafer process is sufficient to be equal to that for an ordinary IGBT. This is because the gate pads 16 can be provided for each cell block 12 merely by modifying a pattern design of a photo mask. Even when the chip size of the IGBT 1 is enlarged, therefore, the rate of non-defective products can be prevented from decreasing (that is, the production yield can be enhanced) while preventing the semiconductor wafer process from being complicated, unlike the construction proposed in JP-A-8-191145.

Also in the embodiment described above, the chip of the IGBT 1 is formed into the rectangular shape and the several gate pads 16 are arranged in a line at one side portion of the chip of the IGBT 1. This makes it easy to design the connected configuration of the gate pads 16 with the outside gate terminal 17. The embodiment is exemplified by wire-bonding the gate electrodes 8 of the defective cell blocks 12 to the ground terminal 19, but the gate electrodes 8 may be wire-bonded to an outside emitter terminal (not-shown). Alternatively, the ground terminal 19 and the emitter electrode may be made common.

Second Embodiment

Figure 4:
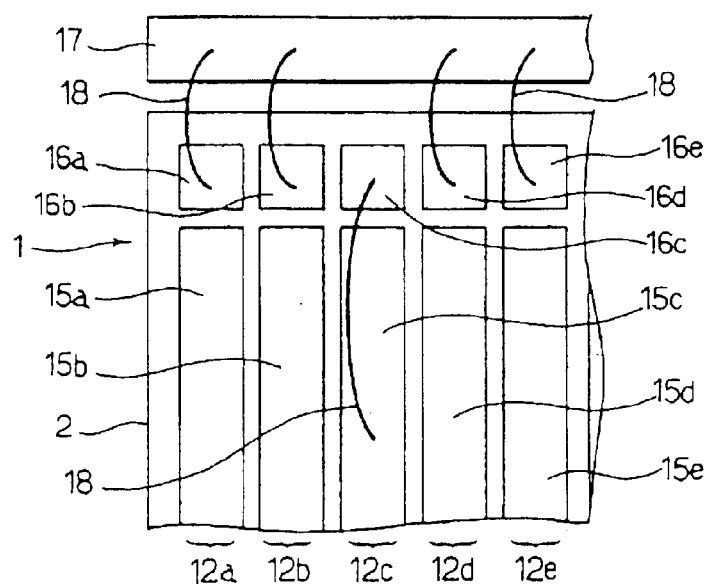
FIG. 4 is a plan view corresponding to FIG. 3, in a second preferred embodiment.

FIG. 4 shows a second preferred embodiment of the present invention, which will be described on its portions different from those of the first embodiment. The same parts as those of the first embodiment will be designated by the same reference numerals in the second and subsequent embodiments. The second embodiment is constructed such that the gate pad 16 (16c) connected with the gate electrodes 8 of the defective cell block 12 is connected through the bonding wire 18 with the emitter pad 15 (15c) provided inside of the chip. As a result, the gate electrodes 8 (the gate pad 16c) of the defective cell block 12 are fixed at the potential of the emitter pad 15. Here, it should be noted this emitter pad is normally connected with the ground to have the ground potential. Accordingly, the gate controlling signal is not fed to the gate electrodes 8 of the defective cell block 12, and the elements in the defective cell block 12 are not operated.

Third Embodiment

Figure 5:
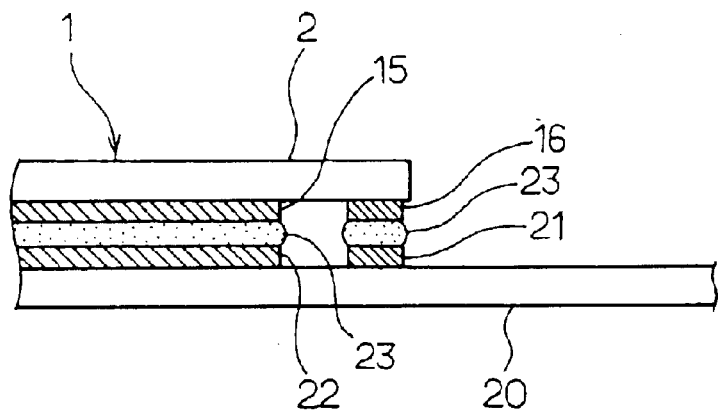
FIG. 5 is a cross-sectional view showing a state in which a gate pad and a gate terminal, and an emitter pad and an emitter terminal are respectively bonded to one another by soldering in a third preferred embodiment.

FIG. 5 shows a third preferred embodiment of the present invention, which will be described on its portions different from those of the first embodiment. In the third embodiment, the gate pads 16 and the external gate terminal, and the gate pads 16 and the external ground terminal are respectively connected by soldering.

As shown in FIG. 5, specifically a gate terminal 21 for connecting the gate pads 16 and an emitter terminal 22 for connecting the emitter pads 15 are formed in advance on the upper face of a circuit board 20 on which the chip of the IGBT 1 is to be mounted. The gate terminal 21 and the emitter terminal 22 are composed of electrodes that are made of for example a conductive pattern formed on the circuit board 20.

The gate pads 16 and the emitter pads 15 of the chip of the IGBT 1 are face-down bonded to the gate terminal 21 and the emitter terminal 22 of the circuit board 20 through a solder layer 23. Here, the constructions of the third embodiment other than those described above are substantially the same as those of the first embodiment, but the third embodiment may be constructed to have a so-called "up-drain type structure" in which the collector electrode 11 is located on the same face side as the emitter electrodes 10.

Therefore, the third embodiment can also achieve substantially the same effects as those of the first embodiment. Especially in the third embodiment, because the gate pads 16 and the emitter pads 15 of the IGBT 1 are bonded to the gate terminal 21 and the emitter terminal 22 of the circuit board 20 by soldering, the cooling performance of the IGBT 1 can be improved. Although in the third embodiment the gate pads 16 and the emitter pads of the chip of the IGBT 1 are bonded to the gate terminal 21 and the emitter terminal 22 of the circuit board 20 by soldering, the connections may be made by direct pressure-welding (pressure-crimping).

Fourth Embodiment

Here will be described a fourth preferred embodiment of the present invention with reference to FIGS. 6 to 10. This embodiment provides a semiconductor device, which can make it easier to connect the gate pads with the gate terminal or the ground terminal thereby to prevent connection errors reliably. The fundamental structure is substantially the same as that of the first embodiment shown in FIG. 1 and 2 and will be described centrally on the different portions.

Figure 7:
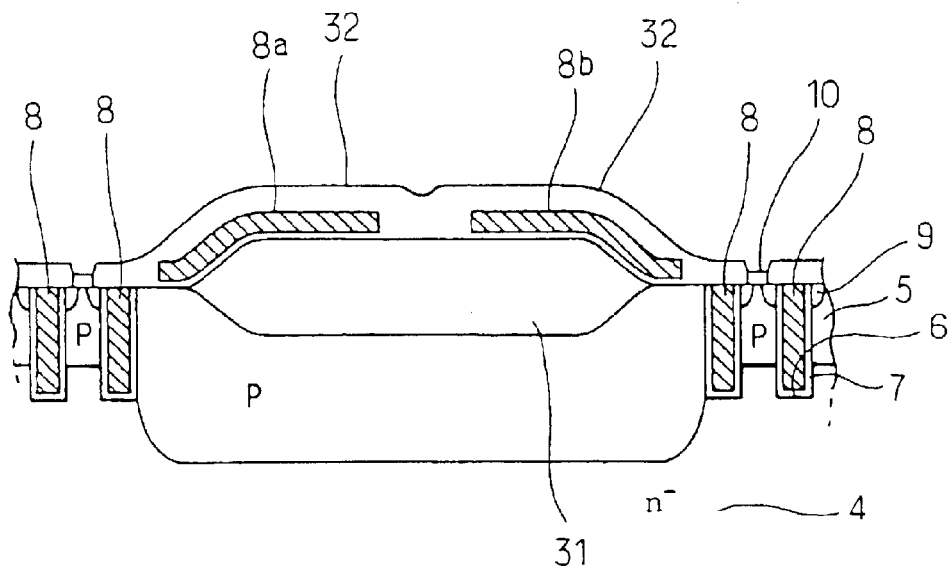
FIG. 7 is a cross-sectional view partially showing the IGBT in the fourth embodiment.

In this embodiment, as shown in FIG. 7, an isolating oxide film ($SiO_2$ film) 31 is formed at the boundary portion between the two cell blocks 12, 12 adjacent to each other. Gate electrodes 8a and 8a, which are electrically isolated from each other, are formed on this isolating oxide film 31, and an intermediate insulating film ($SiO_2$ film) 32 is formed on the gate electrodes 8a and 8a. In FIG. 7, the left side gate electrode 8a is connected with all the gate electrodes 8 in the left side cell block 12, whereas the right side gate electrode 8b is connected with all the gate electrodes 8 in the right side cell block 12.

Figure 8:
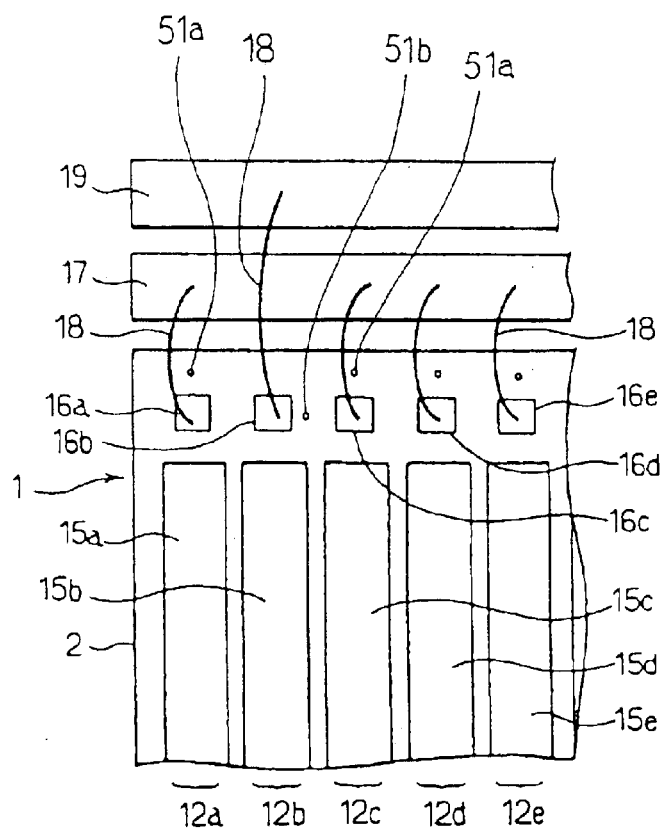
FIG. 8 is a plan view partially showing the IGBT and terminals in the fourth embodiment.

In this embodiment, likewise, as shown in FIG. 8, the gate pads 16 connected with the gate electrodes of the non-defective cell blocks 12 are connected with the gate terminal 17, and the gate pad 16 (16c) connected with the gate electrodes 8 of the defective cell block 12 is connected with the ground terminal 19 outside of the chip.

Figure 6:
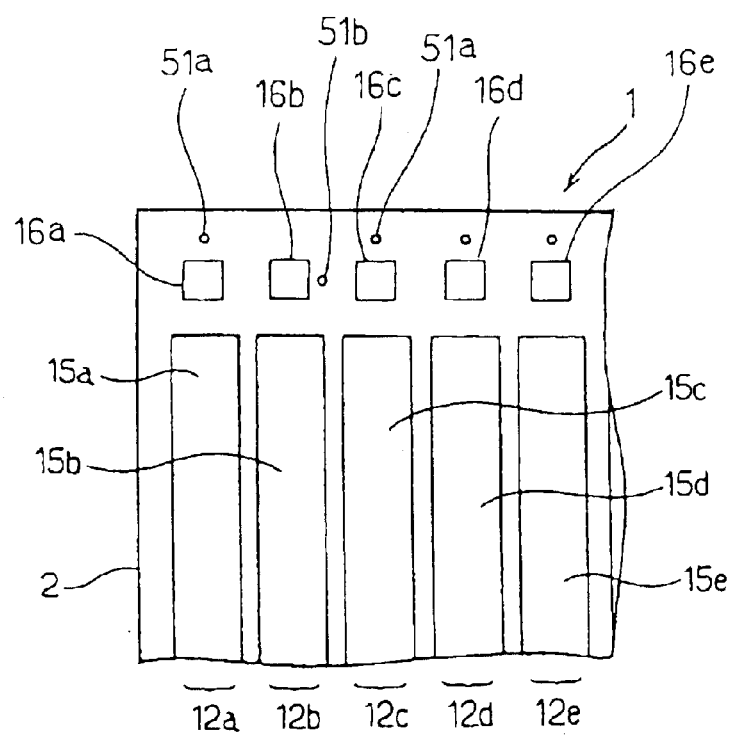
FIG. 6 is a plan view schematically partially showing an IGBT in a fourth preferred embodiment.
Figure 9:
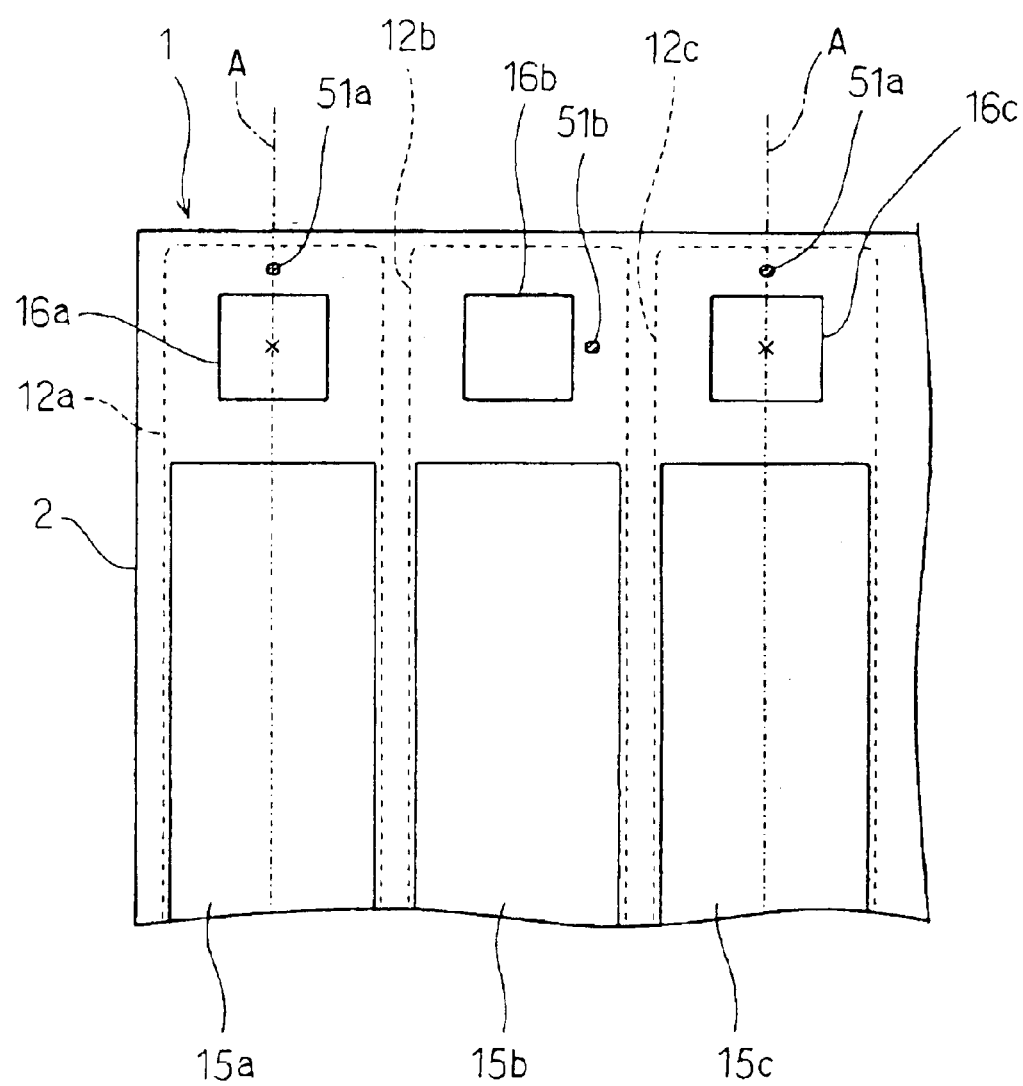
FIG. 9 is a plan view for explaining arrangement locations of marks in the fourth embodiment.

In this embodiment, moreover, as shown in FIGS. 6, 8 and 9, the gate pads 16, connected with the gate electrodes 8 of the non-defective cell blocks 12 over the chip 1 (i.e., the semiconductor substrate 2), are marked at the centers of the upper side portions of their peripheral portions with for example small circles 51a as marks. These small circles 51a are drawn with such ink as can stand the heat treatment when the chip is mounted.

To the contrary, the gate pad 16 (16b), connected with the gate electrodes 8 of the defective cell block 12 (12b) over the chip 1, is marked at the center of the right side portion of its peripheral portion with for example a small circle 51b as a mark. This small circle 51b is also drawn with the same ink as that of the small circles 51a.

In this construction, it is made possible depending on the locations of the small circles 51a and 51b to discriminate whether or not the respective cell blocks 12 are non-defective. Moreover, the regions marked with the small circles 51a and 51b are located in the peripheral portions (i.e., the vicinal regions) of the respective gate pads 16 on the semiconductor substrate 2, and correspond to the regions which are assigned to the respective cell blocks 12 of the semiconductor substrate 2.

In other words, as shown in FIG. 9, the region in the semiconductor substrate 2 to be marked with the marks (e.g., the small circle 51b) can be located on straight lines A which extend through the centers of the gate pads 16 connected with the gate electrodes 8 of the cell blocks 12a and 12c adjoining the cell block 12b to be discriminated, and be closer to the cell block 12 to be discriminated than straight lines A parallel to the boundary lines of the cell blocks 12 (i.e., the region surrounded by the two straight lines A).

With additional reference to FIG. 10, here will be described the process of fabricating the IGBT chip 1 thus constructed and mounting the IGBT chip 1 on the circuit board.

Figure 10:
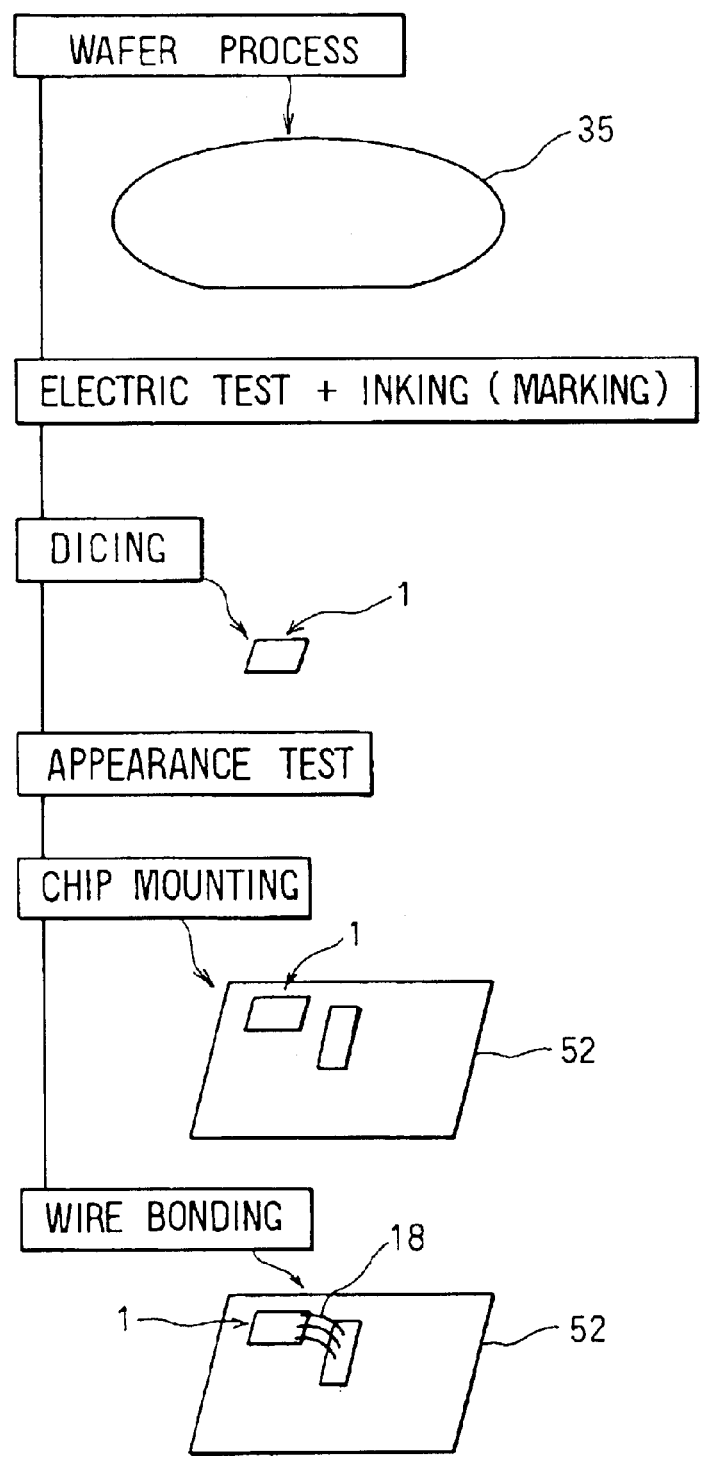
FIG. 10 is a chart for explaining steps for fabricating the IGBT.

First, as shown in FIG. 10 a step of forming a device is performed by subjecting a wafer 35 to a well-known semiconductor wafer process. By executing this step, a number of IGBT chips 1 having the construction shown in FIGS. 6 and 7 are formed on the wafer 35. The several gate pads 16 (gate electrodes) are exposed on the wafer 35.

After the semiconductor wafer process (device formation step) is finished, an electric test step of testing the respective chips 1 on the wafer 35 is carried out. In this case, well-known test element group wafer acceptance test (TEGWAT) and wafer acceptance test (WAT) are carried out. At this electric test step, moreover, each chip 1 is determined on the quality of each of the cell blocks 12 provided therein, by a method similar to that described in the first embodiment using the well-known test device for measuring the withstand voltage between the gate electrode and the emitter electrode. The detailed explanation is omitted here.

All the cell blocks 12 in one chip 1 are determined on their qualities by measuring the withstand voltages between the gate electrodes 8 and the emitter electrodes 10, and the quality determination data are then stored. For the next chip 1, the qualities of the respective cell blocks 12 are determined, and their determination data are stored. For all the chips 1 on the wafer 35, the qualities of the respective cell blocks 12 are likewise determined, and their determination data are stored.

After the cell blocks 12 are determined on their qualities, the peripheral portions of the gate pads 16 on the chip 1 are marked (by printing in ink or by applying ink) with the small circles 51a and 51b as the marks for discriminating the qualities of the cell blocks 12. This step of drawing the small circles 51a and 51b in the ink is an inking step and contained in the aforementioned electric test step.

After this electric test step (the inking step) is carried out, a dicing step of cutting the wafer 35 is carried out. Subsequently, a step of testing the appearances of the cut chips 1 is carried out. After this appearance test step, there is executed a step of mounting the chips 1 on a circuit board 52 or the like.

Then, a step of wire-bonding the pads 15 and 16 of the chip 1 to the terminals 17 and 19 formed on the circuit board 52 is carried out. At this wire-bonding step, it is preferable to employ a wire-bonding apparatus equipped with an image recognition device. The image recognition device of the wire-bonding apparatus recognizes the arrangement locations of the small circles 51a and 51b with respect to the gate pads 16 (i.e., the cell blocks 12), and accordingly all the cell blocks 12 can be precisely recognized on whether they are respectively non-defective or not.

Subsequently, as shown in FIG. 8, the wire-bonding apparatus wire-bonds the gate pads 16, connected with the gate electrodes 8 of the non-defective cell blocks 12, to the gate terminal 17 outside of the chip, and the gate pad 16 (16b), connected with the gate electrodes of the defective sell block 12, to the ground terminal 19 outside of the chip 1. Further, the wire-bonding apparatus wire-bonds all the emitter pads 15 to the emitter terminal outside of the chip 1. As a result, the mounting and the wire-bonding of the IGBT 1 are completed.

According to this embodiment, the several cell blocks 12 are provided on the semiconductor substrate 2 of the chip, and the gate electrodes 8 are provided in the cell blocks 12 to be electrically insulated from one another among the cell blocks 12. Further, the gate pads 16 are provided on the substrate 2 to be electrically connected with the respective gate electrodes 8 for the respective cell blocks 12. Accordingly, even when the chip size is enlarged, the rate of non-defective products can be prevented from decreasing and the semiconductor wafer process can be prevented from being complicated.

In addition, according to this embodiment the small circles 51a and 51b for discriminating whether or not the respective cell locks 12 are non-defective are formed as marks on the peripheral portions of the gate pads 16 (i.e., on the regions, assigned to he respective cell blocks 12, on the semiconductor substrate 2). This makes it easy to discriminate whether or not the cell blocks 12 are non-defective, depending upon the arrangement locations of the small circles (or marks) 51a and 51b. Therefore, the qualities of the respective cell blocks 12 could be automatically discriminated, for example, by the wire-bonding apparatus equipped with the image recognition device for recognizing the small circles 51a and 51b. This wire-bonding apparatus makes it possible to easily execute the step of wire-bonding the gate pads 16 to the gate terminal 17 or the ground terminal 19.

Here, this embodiment is constructed such that the qualities of the cell blocks 12 are tested and such that the marking is performed to the cell blocks 12, both after the semiconductor wafer process is completed. However, the present invention should not be limited to that sequence. After the gate pads 16 are formed on the semiconductor substrate 2, that is, after the wafer process of at least the surface side of the semiconductor substrate 2 is completed, the qualities of the cell blocks 12 may be tested and the marks may be formed.

Fifth Embodiment

Figure 11:
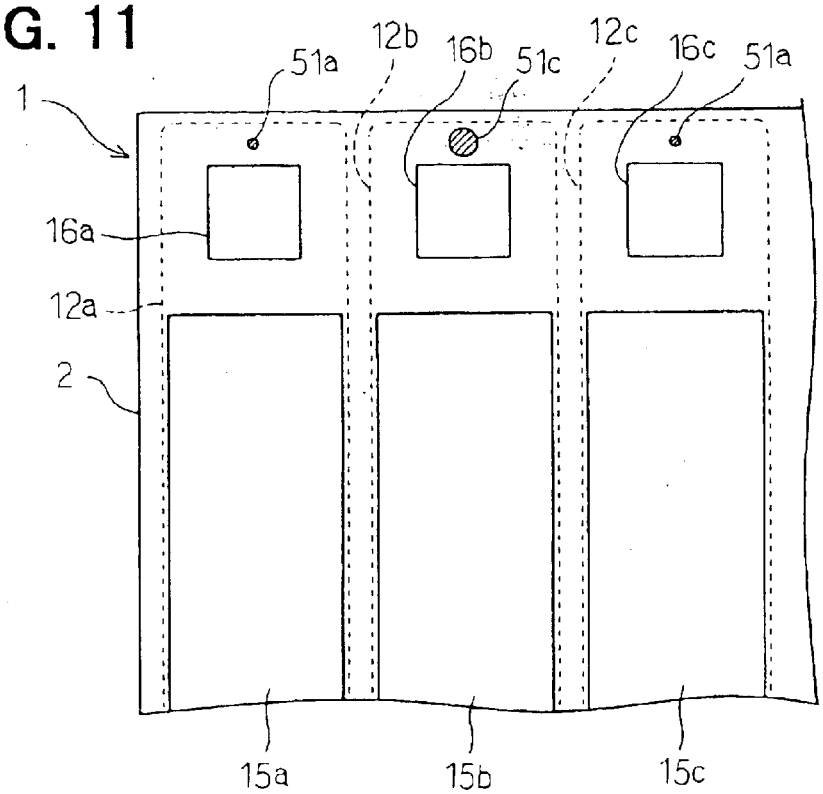
FIG. 11 is a plan view schematically partially showing an IGBT in a fifth preferred embodiment.

FIG. 11 shows a fifth preferred embodiment of the present invention, which will be described on the portions different from those of the fourth embodiment. The same parts as those of the fourth embodiment are designated by the same reference numerals. In the fifth embodiment, marks are exemplified by the small circles 51a for indicating the non-defective cell blocks 12 and by an intermediate circle 51c for indicating the defective cell block 12 (12b). In this case, the arrangement location of the intermediate circle 51c is approximately the same as that of the small circles 51a and is located at the center of the upper side of the peripheral portion of the gate pad 16 (16b).

Specifically, in the fifth embodiment the discriminations of whether or not the respective cell blocks 12 are non-defective are made by the sizes of the marks (i.e., the small circles 51a and the intermediate circle 51c). The other features than the aforementioned points of the fifth embodiment are substantially the same as those of the fourth embodiment.

Sixth Embodiment

Figure 12:
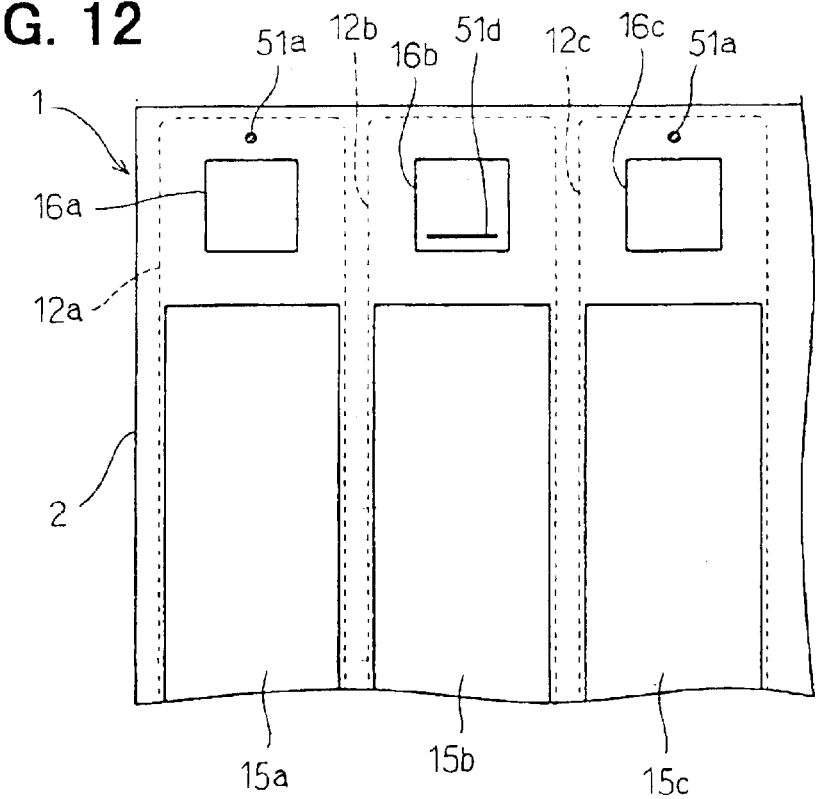
FIG. 12 is a plan view schematically partially showing an IGBT in a sixth preferred embodiment.

FIG. 12 shows a sixth preferred embodiment of the present invention. In the sixth embodiment, the marks are exemplified by the small circles 51a for indicating the non-defective cell blocks 12 and by a transverse bar 51d for indicating the defective cell block 12 (12b). In this case, the transverse bar 51d is located on the lower portion of the upper face of the gate pad 16 (16b).

Specifically, in the sixth embodiment the discriminations of whether or not the cell blocks 12 are non-defective are made based on the shapes of the marks (i.e., the small circles 51a and the transverse bar 51d). In the sixth embodiment, it is possible to discriminate whether or not the cell blocks 12 are non-defective, by the arrangement locations of the marks (i.e., the small circles 51a and the transverse bar 51d). The other features and effects than the aforementioned points of the sixth embodiment are substantially the same as those of the fourth embodiment.

Seventh Embodiment

Figure 13:
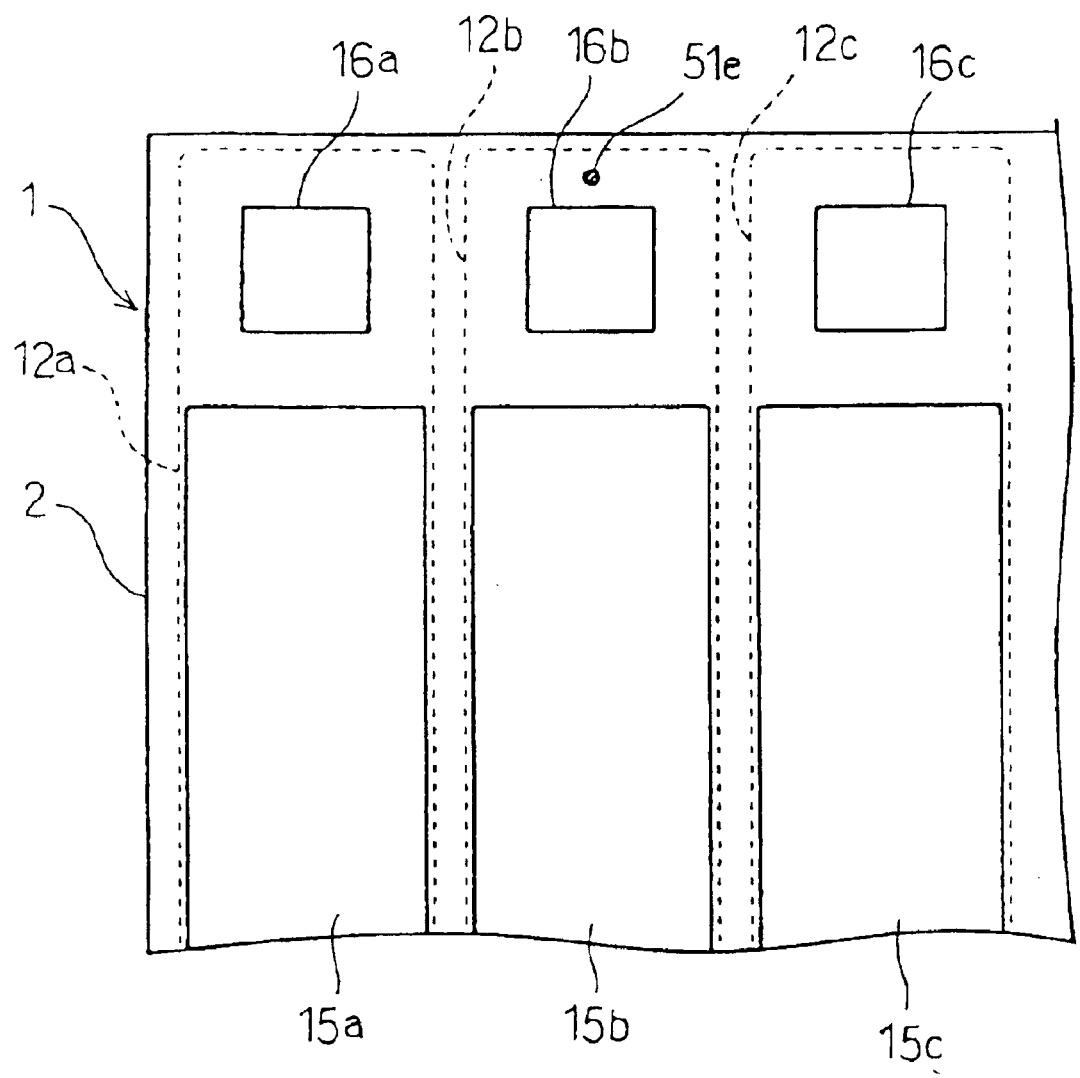
FIG. 13 is a plan view schematically partially showing an IGBT in a seventh preferred embodiment.

FIG. 13 shows a seventh preferred embodiment of the present invention. In the seventh embodiment, only the defective cell block 12 (12b) is marked with a small circle 51e whereas the non-defective cell blocks 12 are not marked. In this case, the small circle 51e is located generally at a center of the upper side of the peripheral portion of the gate pad 16 (16b).

Specifically, in the seventh embodiment the discriminations of whether or not the cell blocks 12 are non-defective are made based on the number (i.e., "0" or "1") of the marks (the small circle 51e). The other features than the aforementioned points of the seventh embodiment are substantially the same as those of the fourth embodiment.

Eighth Embodiment

Figure 14:
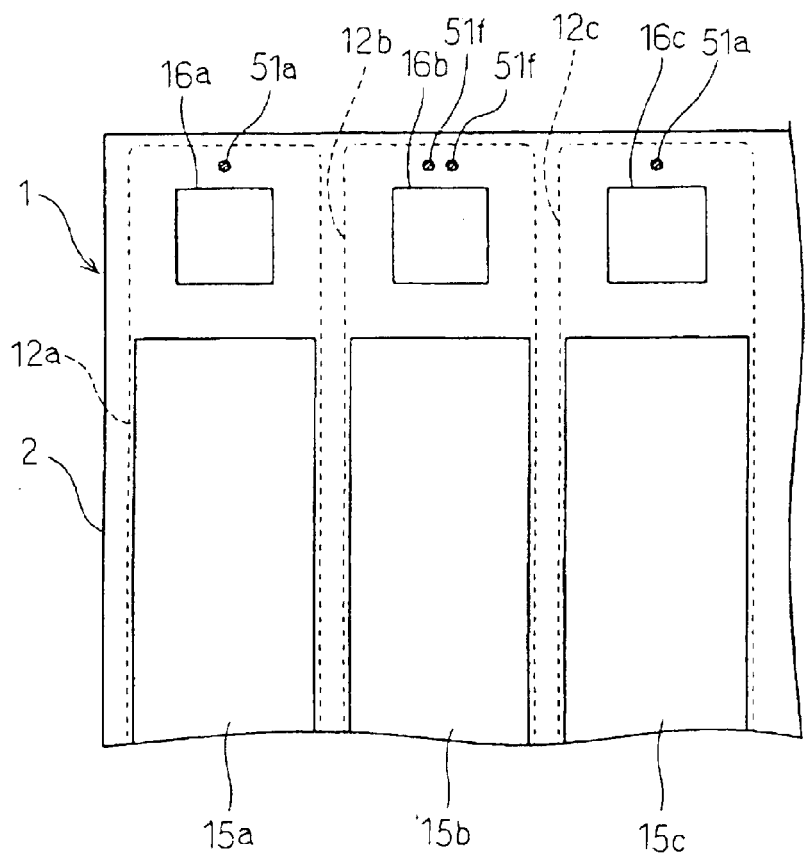
FIG. 14 is a plan view schematically partially showing an IGBT in an eighth preferred embodiment.

FIG. 14 shows an eighth preferred embodiment of the present invention. In the eighth embodiment, the marks are exemplified by one small circle 51a for indicating each of the non-defective cell blocks 12 and by two small circles 51f and 51f for indicating the one defective cell block 12 (12b). In this case, the two small circles 51f and 51f are located generally at a center portion of the upper side peripheral portion of the gate pad 16 (16b).

Specifically, in the eighth embodiment, the discriminations of whether or not the cell blocks 12 are non-defective are made based on the number of marks (i.e., the one small circle 51a and the two small circles 51f and 51f). The other features then the aforementioned points of the eighth embodiment are substantially the same as those of the fourth embodiment.

The fourth to eighth embodiments may be modified such that the color of the marks are changed depending upon whether or not the cell blocks 12 are non-defective. Another modification may be made such that only the mark color is changed, with the mark arrangement, size, shape and number being fixed, depending upon whether or not the cell blocks 12 are non-defective.

Ninth Embodiment

Figure 15:
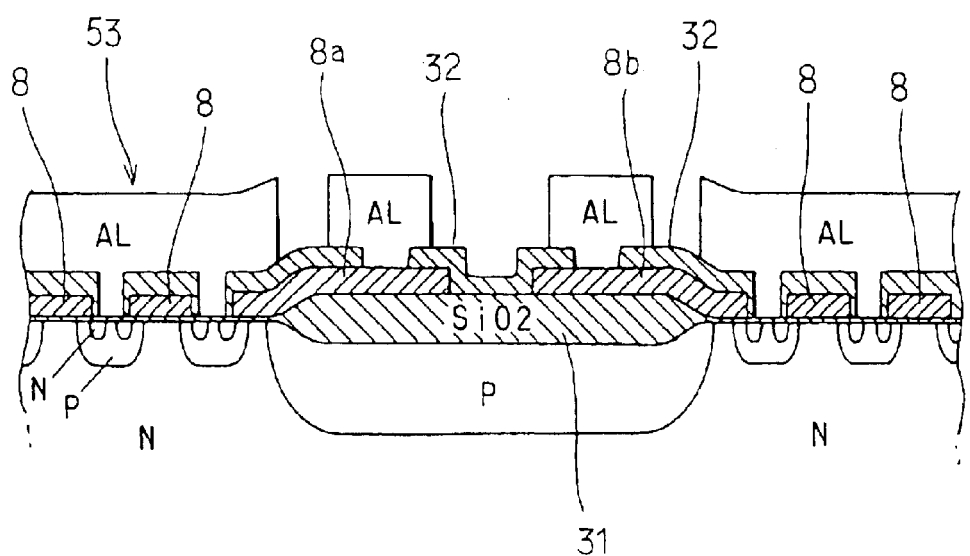
FIG. 15 is a cross-sectional view showing a boundary portion between adjacent two cell blocks of an IGBT in a ninth preferred embodiment.

In the first to eighth embodiments, the present invention has been applied to the trench gate IGBT but may be applied to a planar IGBT. In a ninth preferred embodiment, the present invention is applied to a planar IGBT shown in FIG. 15. FIG. 15 is a schematic longitudinal section showing a boundary portion between two adjoining cell blocks 12 and 12 of a chip 53 of the planar IGBT. The portions common with those of the fourth embodiment are designated by the common reference numerals in the ninth embodiment.

Tenth Embodiment

Figure 16:
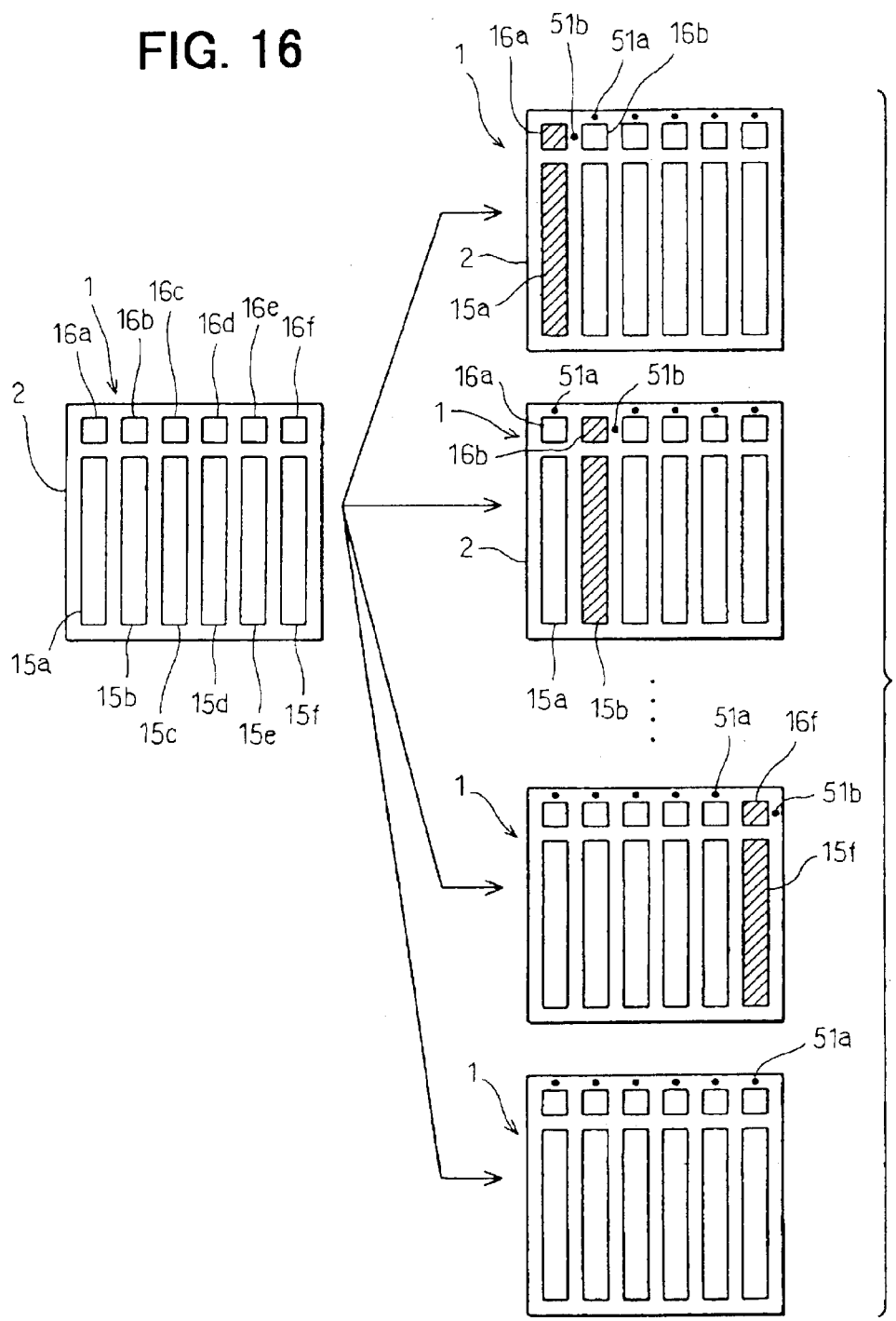
FIG. 16 is a schematic view showing arrangements of defective cell blocks in IGBT chips in a tenth preferred embodiment.
Figure 17:
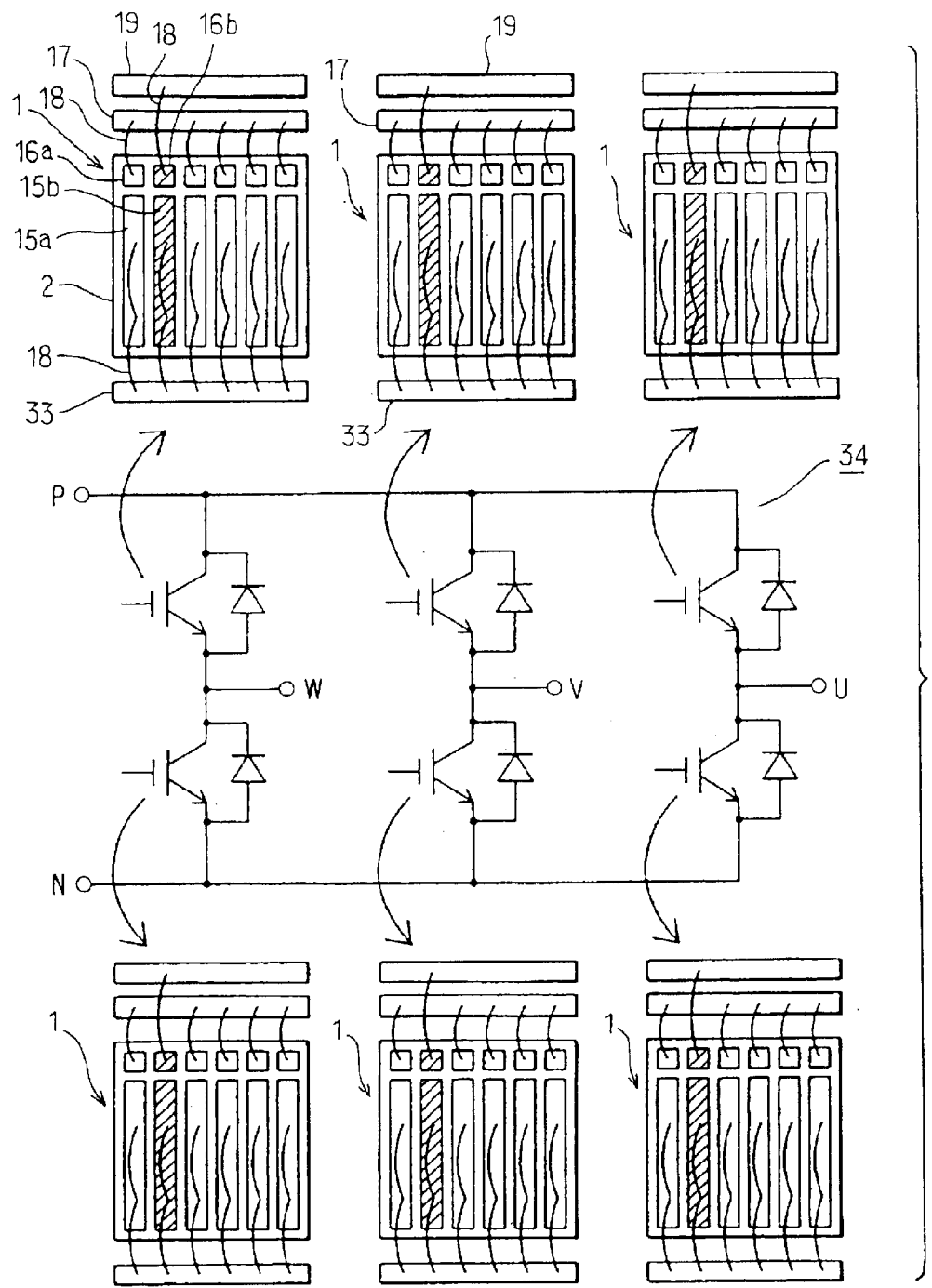
FIG. 17 is a schematic view showing an electric circuit and IGBT chips of an IGBT module in the tenth embodiment.

FIGS. 16 and 17 show a tenth preferred embodiment of the pre sent invention in the tenth embodiment, as shown in FIG. 16 chips each having the defective cell block 12 arranged at the same position are gathered and sorted.

When the chips 1 respectively have six cell blocks 12, more specifically, they are sorted, as shown in FIG. 16, into; a group of the chips 1 each of which has the left side first cell block 12 being defective; a group of the chips 1 each of which has the left side second cell block 12 being defective; . . . ; a group of the chips 1 each of which has the left side sixth (i.e., the right side first) cell block 12 being defective; and a group of the chips 1, in each of which all the cell blocks 12 are non-defective. There has been described above the case in which one cell block 12 is defective. When two or more cell blocks 12 are defective, it is preferable to sort the chips 1 likewise.

When the aforementioned sorting of the chips 1 is performed, it is preferable to employ a chip transfer machine (not-shown) capable of holding the chips selectively in several trays. For example, the chip transfer machine is equipped with an image recognition device so that all the cell blocks 12 can be precisely recognized on whether or not they are non-defective, by recognizing the arrangement locations of the marks (for example, the small circles 51*a* and 51*b*) with respect to the gate pads 16 (i.e., the cell blocks 12) on the chips 1. On the basis of the recognition results, the chips 1 are preferably picked up and sorted so that the chips 1 having the same arrangements of the defective cell blocks 12 gather and are stocked in the trays.

In the tenth embodiment described above, further, as shown in FIG. 17, a 6-in-1 type IGBT module 34 is manufactured by for example six chips 1 sorted as above. The IGBT module 34 shown in FIG. 17 uses the six chips 1 in each of which the left side second cell block 12*b* is defective. Here, the marks (the small circles 51*a* and 51*b*) are omitted from the chips 1 shown in FIG. 17.

When the six chips 1 are to be mounted on the circuit board 1, they are placed first on the circuit board and are fixed thereto by adhering or soldering. Next, for these six chips 1, the gate pads 16, connected with the gate electrodes 8 of the non-defective cell blocks 12, are connected with the outside of the chips 1, i.e., with the gate terminal 17 mounted on the circuit board by wire-bonding. On the other hand, the gate pad 16, connected with the gate electrodes 8 of the defective cell blocks 12, is connected with the outside of the chips 1, i.e., with the ground terminal 19 mounted on the circuit board by wire-bonding. Moreover, the emitter pads 15 are connected with the outside of the chips 1, i.e., with an emitter terminal 33 provided on the circuit board by wire-bonding.

Thus, the assembling of the IGBT module 34 is completed. Then, the IGBT module 34, i.e., the circuit board is assembled into a package, thereby completing the manufacture of the IGBT module 34. On the other hand, the other features than the aforementioned points of the tenth embodiment are substantially the same as those of the fourth embodiment. In the tenth embodiment, therefore, it is possible to achieve the same effects as those of the fourth embodiment.

Here in this tenth embodiment, the IGBT module 34 may be manufactured by using, in place of the six chips 1 in which the left side second cell blocks 12 are defective, six chips 1 in which other cell blocks 12 are defective. The tenth embodiment is applied to the construction in which the IGBT module 34 is exemplified by the 6-in-1 type IGBT module 34 employing the six chips 1. However, the tenth embodiment is not limited to this but may be applied to constructions for manufacturing a 2-in-1 type IGBT module, a 7-in-1 type IGBT module, an IGBT discrete package and the like.

On the other hand, in the aforementioned embodiments, the gate pads 16 connected with the gate electrodes 8 of the defective cell blocks 12 are connected with the ground terminal 19 outside of the chip 1. However, the gate pads 16 connected with the gate electrodes 8 of the defective cell blocks 12 may be connected with for example the emitter pads 15 provided inside of the chip 1 by wire-bonding. In this construction, the gate electrodes 8 (the gate pads 16) of the defective cell blocks 12*b* are fixed at the potential of the emitter pads 15, i.e., at the potential of the emitter terminal 33 outside of the chip 1.

Because the emitter terminal 33 (or the emitter pads 15) is usually connected with the ground, the emitter pads 15 has the ground potential. As a result, the gate electrodes 8 of the defective cell blocks 12 are not fed with the gate controlling signal so that the elements in the defective cell blocks 12 are not operated.

Otherwise, the gate electrodes 8 of the defective cell blocks 12 may be wire-bonded to the emitter terminal 33 provided outside of the chip 1 in place of the emitter pads 15 provided inside of the chip 1. Moreover, the ground terminal 19 and the emitter terminal 33 may be constructed as a common terminal. Still moreover, the gate pads 16, connected with the gate electrodes 8 of the defective cell blocks 12, may be connected by wire-bonding with a ground pad (the ground terminal) disposed inside of the chip 1.

In the embodiments described above, the cell blocks 12 respectively have emitter electrodes 10 with which the emitter pads 15 are respectively connected. However, the emitter pads may be provided in common with all the cell blocks 12 or with some of the cell blocks 12 while making the gate electrodes 8 independent of each other for the respective cell blocks 12. The p base layer 5 may be a single base in common with all the cell blocks, or an island-shaped base for some of the cell blocks. In the case of the island-shaped base, the withstand voltage is improved by setting a distance between two island-shaped bases such that depletion layers extend respectively from the island-shaped bases toward the n⁻ drift layer to be connected with each other at the gate-off time.

Also in the embodiments described above, although the interconnection between the gate pads 16 and the external gate terminal and between the gate pads 16 and the external ground terminal are carried out by wire-bonding, it may be limited to this but be carried out by for example soldering, direct-bonding (crimping), or the like.

Eleventh Embodiment

Here will be described an eleventh preferred embodiment of the present invention. This embodiment is also constructed, as in the tenth embodiment, such that the chips 1 are so sorted that the chips 1 having the same arrangements of the defective cell blocks 12 may gather. In the tenth embodiment, the sorting is performed by marking the non-defective and defective cell blocks. In this embodiment, however, the sorting is performed without any marking. Here, the fundamental element structure of each IGBT chip 1 is substantially the same as those of the aforementioned embodiments for example as shown in FIGS. 1, 2 and 7.

Figure 18:
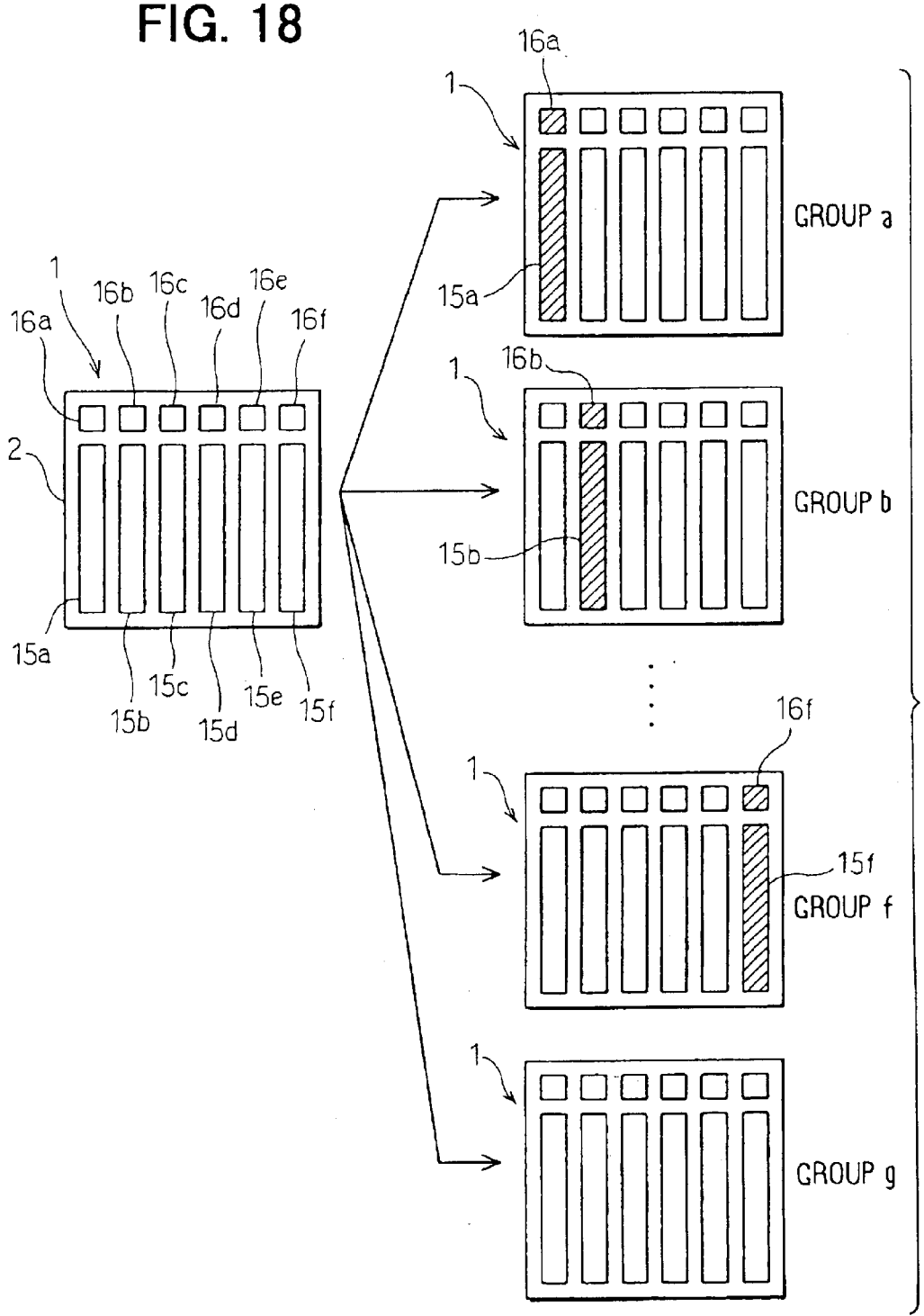
FIG. 18 is a schematic view showing arrangements of defective cell blocks in IGBT chips in an eleventh preferred embodiment.
Figure 19:
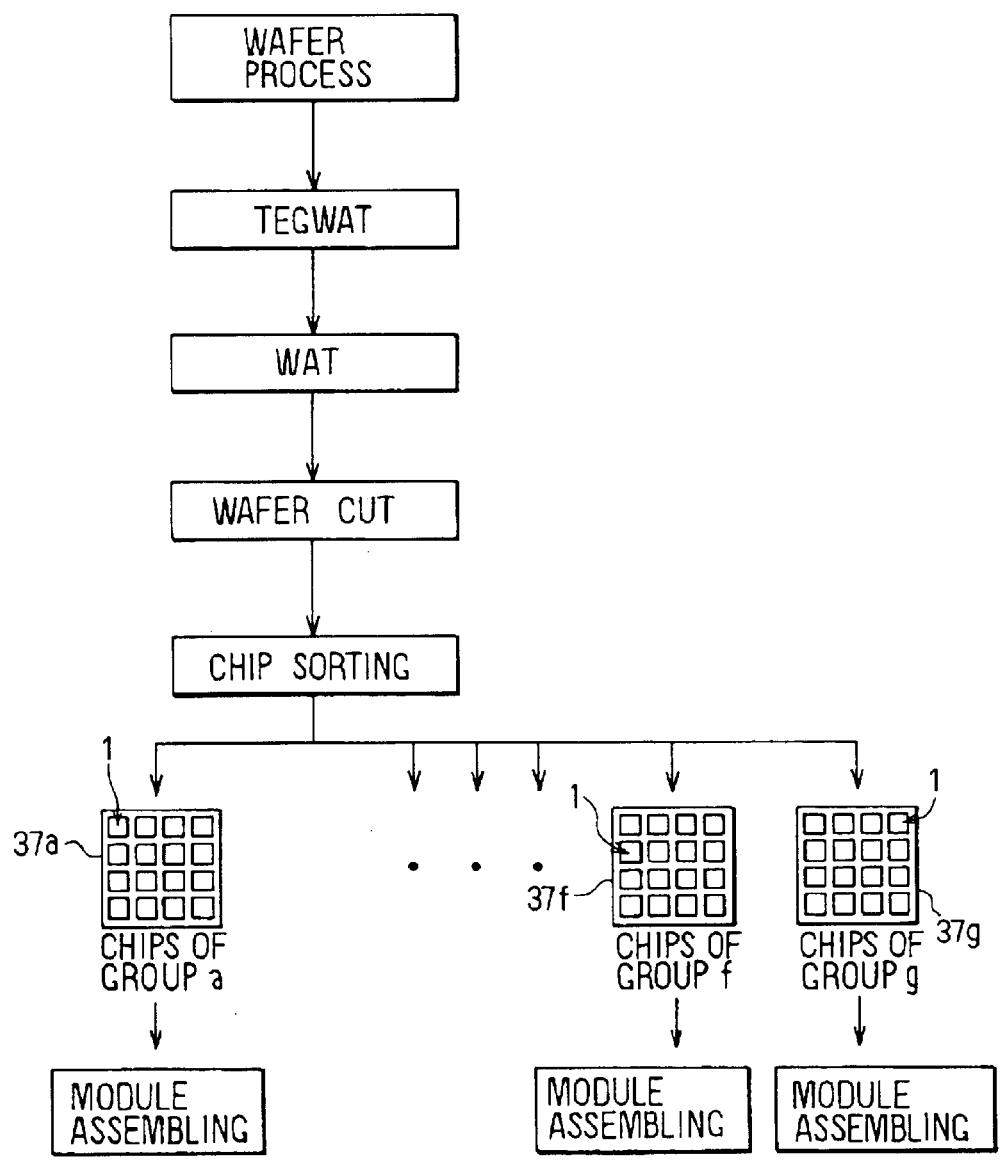
FIG. 19 is an explanatory view for explaining a process of fabricating an IGBT module in the eleventh embodiment.
Figure 20:
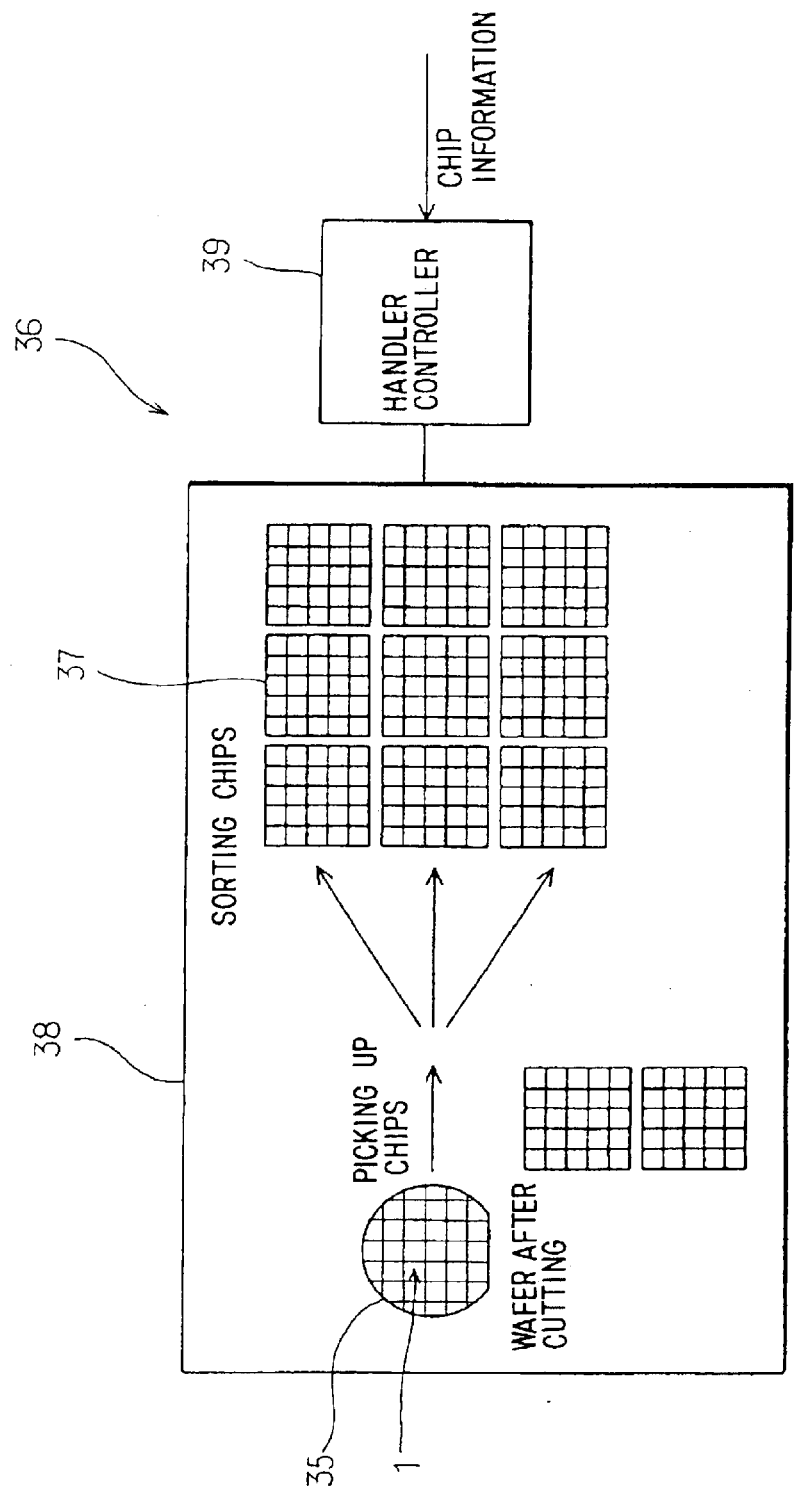
FIG. 20 is a block diagram showing a chip transfer machine.

A process for manufacturing IGBT chips 1 and a process for manufacturing an IGBT module 34 as shown in FIG. 17 but having no mark, from several (e.g., six) IGBT chips 1 will be explained with reference to FIGS. 18 to 20.

First, the well-known semiconductor wafer process is performed to the wafer 35 at the device formation step substantially in the same manner as in the first embodiment. Accordingly, plural IGBT chips 1 as shown in FIGS. 1, 2, and 7 are provided. After this device formation step, the step of testing the respective chips 1 on the wafer 35 is carried out by the method as described in the aforementioned embodiments. Specifically, there is executed at first the well-known test element group wafer acceptance test (TEGWAT). Subsequently, there is executed the well-known wafer acceptance test (WAT). At the time of executing this WAT, it is respectively determined whether or not the cell blocks 12 are non-defective by measuring the withstand voltages between the gate electrodes and the emitter electrodes using the well-known test device. The detailed explanation for the test is not be reiterated.

After all the cell blocks 12 in one chip 1 are determined on their qualities by measuring the withstand voltages between the gate electrodes 8 and the emitter electrodes 10, the quality determination data are stored. For the next chip 1, similarly, the qualities of the respective cell blocks 12 are determined, and their determination data are stored. For all the chips 1 on the wafer 35, the qualities of the respective cell blocks 12 are likewise determined, and their determination data are stored. In this case, the stored determination data of the respective chips 1 provide chip information for sorting the respective chips 1. In short, the chip information is acquired. This acquired chip information is fed to a later-described chip transfer machine 36 shown in FIG. 20.

After the aforementioned WAT is carried out, the dicing step of cutting the wafer 35 is carried out. After this, there is executed a step of sorting the cut chips 1, i.e., a sorting step of sorting the chips 1 such that the chips 1 are so sorted that the chips 1 having the same arrangements of the defective cell blocks 12 may gather. Since the chips 1 are equipped in this case with six cell blocks 12, more specifically, they are sorted, as shown in FIG. 18, into: a group a of the chips 1 in each of which the left side first cell block 12 is defective; a group b of the chips 1 in each of which the left side second cell block 12 is defective; . . . ; a group f of the chips 1 in each of which the left side sixth (or the right side first) cell block 12 is defective; and a group g of the chips in each of which all the cell blocks 12 are non-defective. Although there has been described the case in which one cell block 12 is defective, when two or more cell blocks 12 are defective, it is preferable to sort the chips 1 likewise.

This embodiment uses the chip transfer machine 36 that can hold the chips 1 selectively in several trays 37 (37a, 37b, 37c, . . . ). This chip transfer machine 36 is constructed, as shown in FIG. 20, to include a handler 38 for sorting and holding the chips in the trays 37 and a handler controller 39 for driving and controlling the handler 38. The handler controller 39 supplies a control signal to the handler 38 upon receiving the chip information acquired at the aforementioned WAT step, thereby to drive the handler 38 on the basis of the chip information. As a result, the wafer-cut chips 1 are picked up and are so sorted that the chips 1 having the same arrangements of the defective cell blocks 12 gather and are held in the trays 37 as shown in FIGS. 19 and 20.

After the sorting step is carried out, a step of assembling the IGBT module 34 is carried out by using the chips sorted as above. In the case of this embodiment, as shown in FIG. 17, the 6-in-1 type IGBT module 34 including six chips 1 is used as an example. The specific process for manufacturing the module is similar to that described in the tenth embodiment and will be omitted here.

In this embodiment, because the chips are so sorted that the chips 1 having the same arrangements of the defective cell blocks 12 gather together, the wire-bonding step can be more easily performed by for example the wire-bonding apparatus, so that the gate pads 16 can be more easily connected to the gate terminal 17 or the ground terminal 19. Also this embodiment adopts the chip transfer machine 36, which can select and hold the chips 1 in the trays 37, for sorting the chips 1. This makes it easier to realize the construction (the manufacture facilities) for sorting the chips 1.

Moreover, this embodiment is constructed such that at the time of executing the wafer acceptance test (WAT), the chip information for sorting the chips 1 is acquired and fed to the chip transfer machine 36. According to this construction, the chip transfer machine 36 can sort the chips 1 easily and reliably on the basis of the acquired chip information. It is unnecessary unlike the tenth embodiment to mark the chips for discriminating the non-defective and defective chips. Therefore, it is possible to simplify the manufacture process.

Twelfth Embodiment

Figure 21:
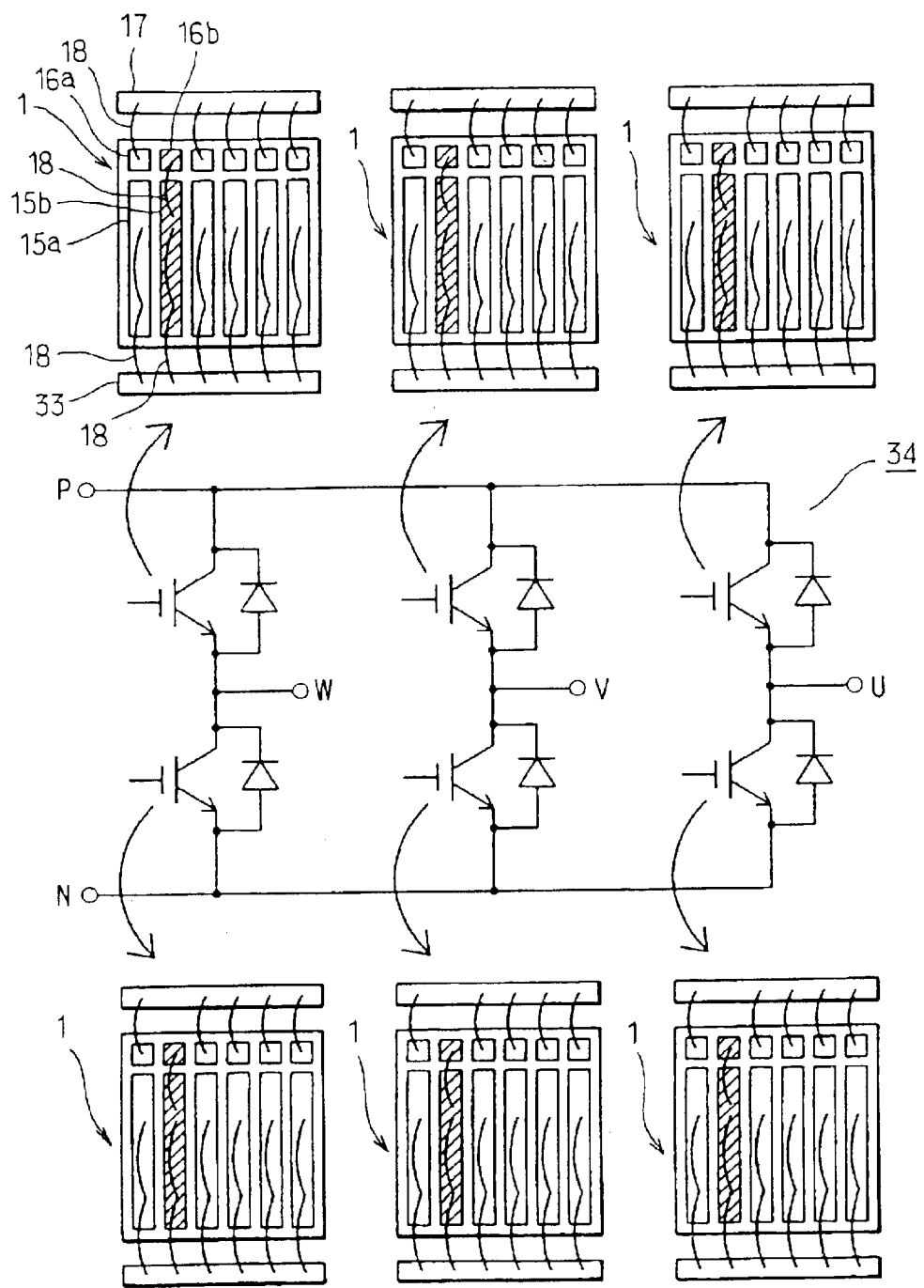
FIG. 21 is a schematic view showing an electric circuit of an IGBT module and IGBT chips constituting the IGBT chips in a twelfth preferred embodiment.

FIG. 21 shows a twelfth preferred embodiment of the present invention, which will be described on the portions different from those of the eleventh embodiment. The twelfth embodiment is constructed such that the gate pad 16 (16b), connected with the gate electrodes 8 of the defective cell blocks 12, is connected with the emitter pad 15 (15b) inside of the chip through for example the bonding wire 18. As a result, the gate electrodes 8 (the gate pad 16b) of the defective cell block 12b is fixed at the potential of the emitter pad 15 (15b), i.e., at the potential of the emitter terminal 33 provided outside of the chips 1.

Because the emitter terminal 33 (the emitter pads 15) is usually connected with the ground so that the emitter pads 15 have the ground potential. As a result, the gate electrodes 8 of the defective cell block 12 (12b) is not fed with the gate controlling signal so that the elements in the defective cell block 12 are not operated. The other constructions of the twelfth embodiment excepting the aforementioned one are substantially the same as those of the eleventh embodiment.

Here, this embodiment is constructed such that the gate electrodes 8 of the defective cell block 12 are wire-bonded to the emitter pad 15 (15b) provided inside of the chip 1, but may be constructed such that the gate electrodes 8 are wire-bonded to the emitter terminal 33 provided outside of the chip 1. Further, the ground terminal 19 and the emitter terminal 33 may be constructed as a common terminal.

Thirteenth Embodiment

Figure 22:
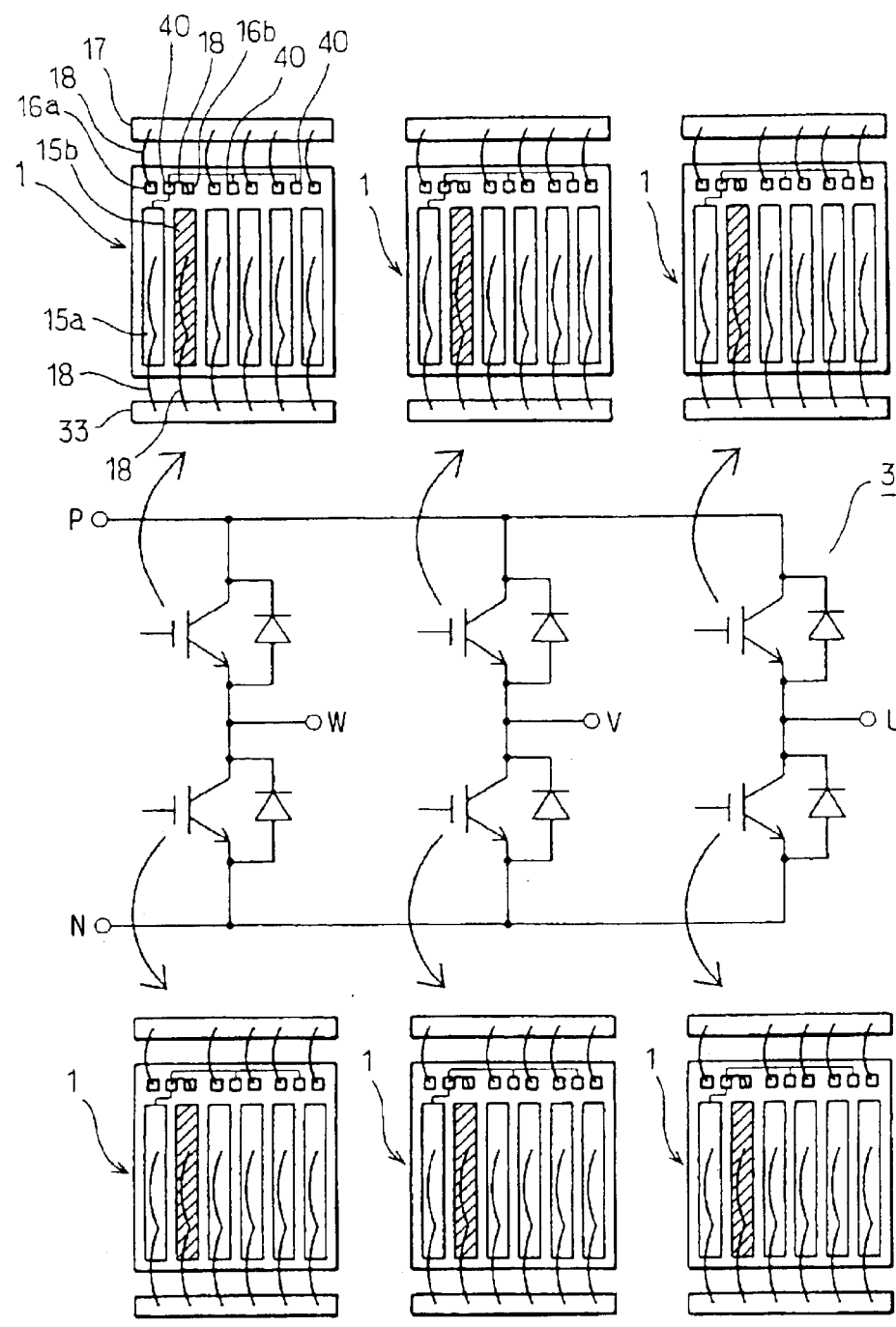
FIG. 22 is a schematic view corresponding to FIG. 21, in a third preferred embodiment.

FIG. 22 shows a thirteenth preferred embodiment of the present invention, which will be described on the portions different from those of the eleventh embodiment. The thirteenth embodiment is constructed such that the gate pad 16 (16b), connected with the gate electrodes 8 of the defective cell block 12, is connected with ground pads (ground terminals) 40 through a bonding wire 18, for example. As a result, the gate electrodes 8 (the gate pad 16b) of the defective cell block 12b are fixed at the potential of the ground pads 40. The other constructions of the thirteenth embodiment excepting the aforementioned one are substantially the same as those of the eleventh embodiment.

Fourteenth Embodiment

Figure 23:
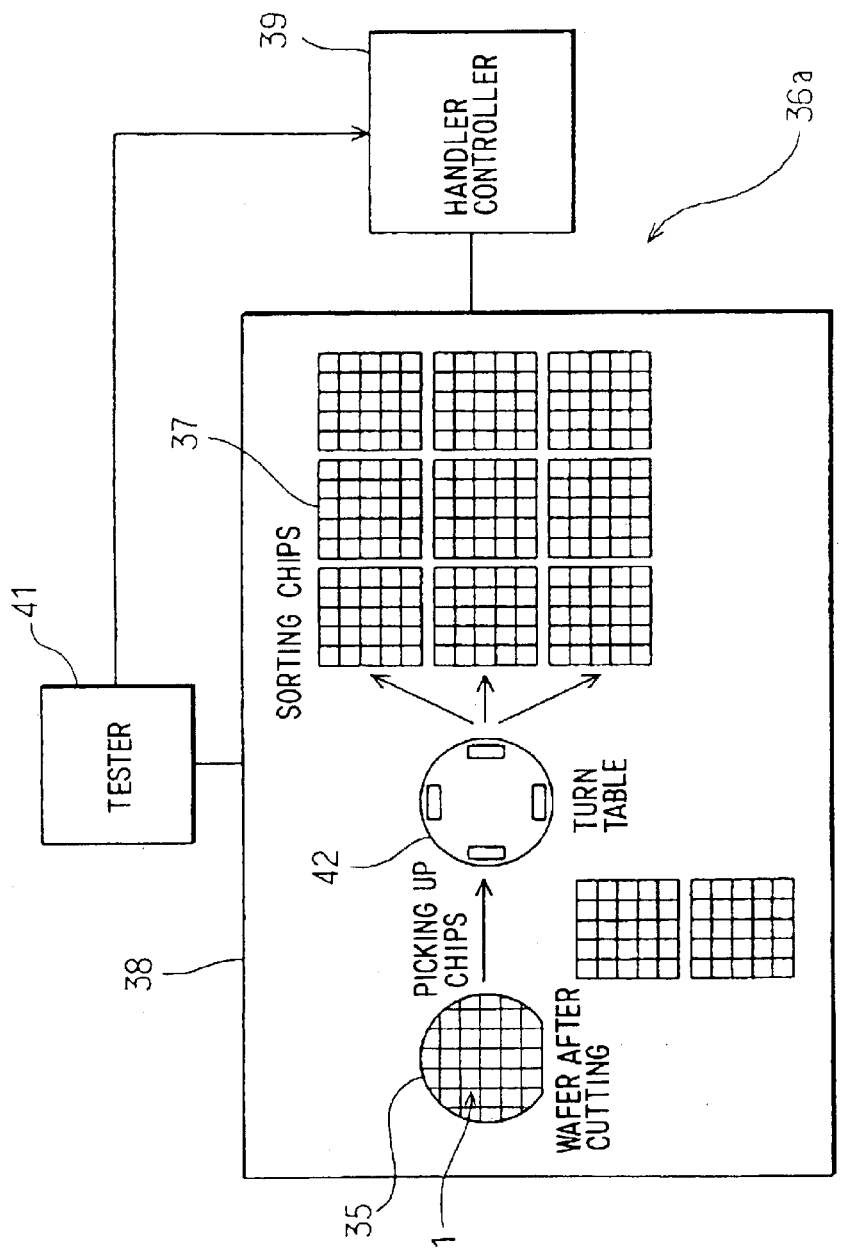
FIG. 23 is a block diagram showing a chip transfer machine in a fourteenth preferred embodiment.

FIG. 23 shows a fourteenth preferred embodiment of the present invention, which will be described on the portions different from those of the eleventh embodiment. The same parts and components as those of the eleventh embodiment are designated by the same reference numerals. The fourteenth embodiment adopts a chip transfer machine 36a having a function for measuring characteristics of the chips 1. Therefore, the chip transfer machine 36a can acquire the chip information for sorting the chips 1 by itself.

As shown in FIG. 23, specifically, the chip transfer machine 36a in the fourteenth embodiment includes a tester (measuring device) 41 for measuring the characteristics of the chips 1, and a measuring turntable 42 disposed inside of the handler 38. In the case of this construction, the handler controller 39 drives and controls the handler 38 to pick up the chip 1, formed by cutting a wafer, onto the metering turntable 4, and the respective cell blocks 12 of the chip 1 are determined on their qualities by the tester 41. The tester 41 then feeds the determination data (i.e., the chip information) to the handler controller 39.

Then, the handler controller 39 drives and controls the handler 39 on the basis of the determination data such that the chip 1 on the metering turntable 42 is picked up, is sorted into a group having the same arrangement of the defective cell block 12, and stocked in the tray 37. The other constructions of the fourteenth embodiment excepting the aforementioned one are substantially the same as those of the eleventh embodiment.

Especially in the fourteenth embodiment, at the time of the WAT step, it is unnecessary to decide whether or not the respective cell blocks 12 of the chips are non-defective. It is also unnecessary to feed the chip information from the test device to the chip transfer machine 36 (36a). According to this construction, the sorting of the chips 1 can be executed more precisely and the gate pads 16 can be connected with the gate terminal 17 or the ground terminal 19 more precisely.

Also in the fourteenth embodiment, when the qualities of the respective cell blocks 12 of the chips 1 are to be determined by the tester 41 of the chip transfer machine 36a, at least one (preferably all) of threshold voltage Vth, collector-emitter voltage Vce (sat) and switching characteristics of the chips 1 may be measured. In this case, the chip transfer machine 36a sorts the chips on the basis of not only the information of the arrangements of the defective cell blocks 12 but also the at least one of the threshold voltage Vth, the collector-emitter voltage Vce (sat) and the switching characteristics of the chips 1. According to this construction, when an insulated gate type power IC module is to be manufactured by using several (e.g., six) chips 1, it is possible to manufacture the IGBT modules with a high quality and little characteristic dispersion.

Here, the aforementioned eleventh to thirteenth embodiments may be modified such that at the time of the WAT step, not only the qualities of the respective cell blocks 12 of the chips 1 are determined but also at least one (preferably all) of the threshold voltage Vth, the collector-emitter voltage Vce (sat) and the switching characteristics of the chips 1 are measured so that the measuring result is fed in addition to the chip information to the chip transfer machine 36 (36a). When the chips 1 are to be sorted by the chip transfer machine 36 (36a), the chips 1 can be sorted on the basis of not only the information of the arrangements of the defective cell blocks 12 but also the at least one of the threshold voltage Vth, the collector-emitter voltage Vce (sat) and the switching characteristics of the chips 1.

In the tenth to fourteenth embodiments, the IGBT module 34 is constructed by employing the six chips 1 having the same arrangements of the defective cell blocks 12 therein. Alternatively, the IGBT module 34 may be constructed by employing six chips 1, one of which has a different arrangement of the defective cell block 12 from those of the other.

Also in the aforementioned embodiments, although the present invention is applied to the construction for manufacturing the 6-in-1 type IGBT module having the six chips 1 as the IGBT module 34, it is not limited to this. For example the present invention may be applied to a construction for manufacturing a 2-in-1 type IGBT module, a 7-in-1 type IGBT module, an IGBT discrete package or the like.

Moreover, the aforementioned first to fourteenth embodiments are constructed such that the IGBT chip 1 is provided with the several emitter pads 15 which are respectively connected with the emitter electrodes 10 of the cell blocks 12. However, the construction may be modified such that the gate electrodes 8 are made exclusively independent for the blocks and such that the emitter pads 15 are made common either for all the cell blocks or for some of the cell blocks. Further, the P base layer 5 may be exemplified either by a single base common to the respective cell blocks or by island-shaped bases set for each cell block or for some of the cell blocks. Here in the island-shaped bases, the construction is excellent in the withstand voltage if the base distance is so set that depletion layers extending from the island-shaped bases to the n⁻ drift layer 4 are connected with each other at the gate-off time.

The aforementioned respective embodiments are constructed such that the connections between the gate pads 16 and the external gate terminal and the connections between the gate pads 16 and the external ground terminal are made by wire-bonding. However, the construction should not be limited thereto but may be modified such that the connections are made by a soldering method or a direct pressure-contacting (pressure-bonding) method.

Moreover, in the aforementioned first to fourteenth embodiments, the gate pads 16 are arranged on one side portion of the chips of the IGBT 1. However, the construction should not be limited thereto but may be modified such that the arrangements of the gate pads 16 are designed to correspond to the connection mode for connecting the gate pads 16 to the external gate terminal. Although in the aforementioned respective embodiments, the present invention is applied to the n-channel type IGBT but may be applied to a p-channel type. The potential of the gate electrodes 8 of the defective cell blocks should not be limited to the ground potential provided that it can be fixed at a level where channels of the respective cells are not inverted.

Fifteenth Embodiment

Here will be described a fifteenth preferred embodiment of the present invention. According to this embodiment, there is provided as an application of the aforementioned embodiments a semiconductor device structure which can reduce a package size and can be cooled from surfaces of the chip. This embodiment also adopts the IGBT chip 1 having substantially the same cross-sectional structure as that shown in FIGS. 2 and 7. The embodiment will be described on the points different from those of the aforementioned embodiments with reference to FIGS. 24 to 29.

Figure 25:
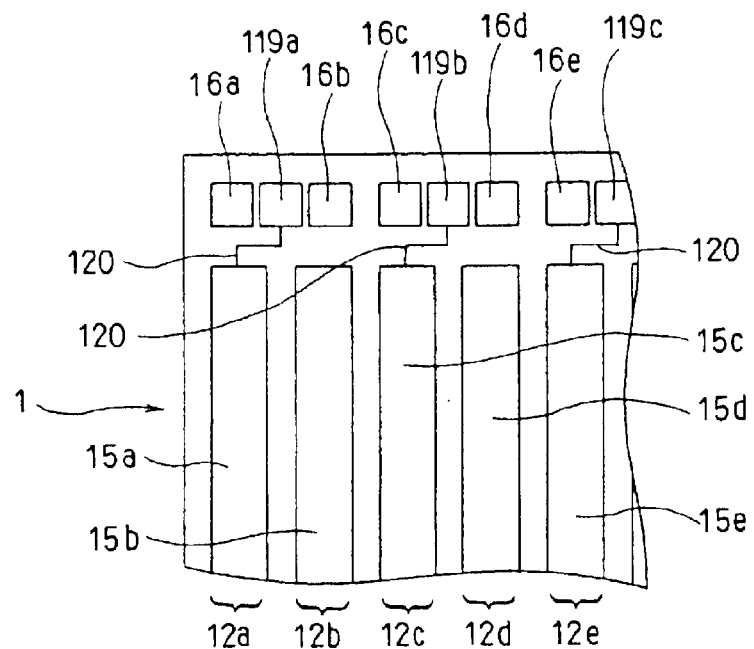
FIG. 25 is a plan view partially showing the IGBT in the fifteenth embodiment.

Here, as shown in FIG. 25, the chip 1 of the IGBT is formed into a generally rectangular plane shape and is provided, at its surface portions corresponding to the several cell blocks 12 (12a, 12b, 12c, ...), with several emitter pads 15 (15a, 15b, 15c, ...) having generally the same shape as (or a slightly smaller shape than) that of the cell blocks 12. On an upper side portion in FIG. 25 of the surface of the IGBT chip 1, several generally square gate pads 16 (16a, 16b, 16c, ...) are arranged to correspond to the aforementioned emitter pads 15.

Several generally square pads 119 (119a, 119b, 119c, ...) are disposed for example alternatively between the gate pads 16 on the surface of the IGBT chip 1. The pads 119 are connected with the emitter pads 15 through wiring members 120 to have an emitter potential. Specifically, the pads 119 having the emitter potential are formed adjacent to the gate pads 16 on the surface of the chip 1.

Figure 26:
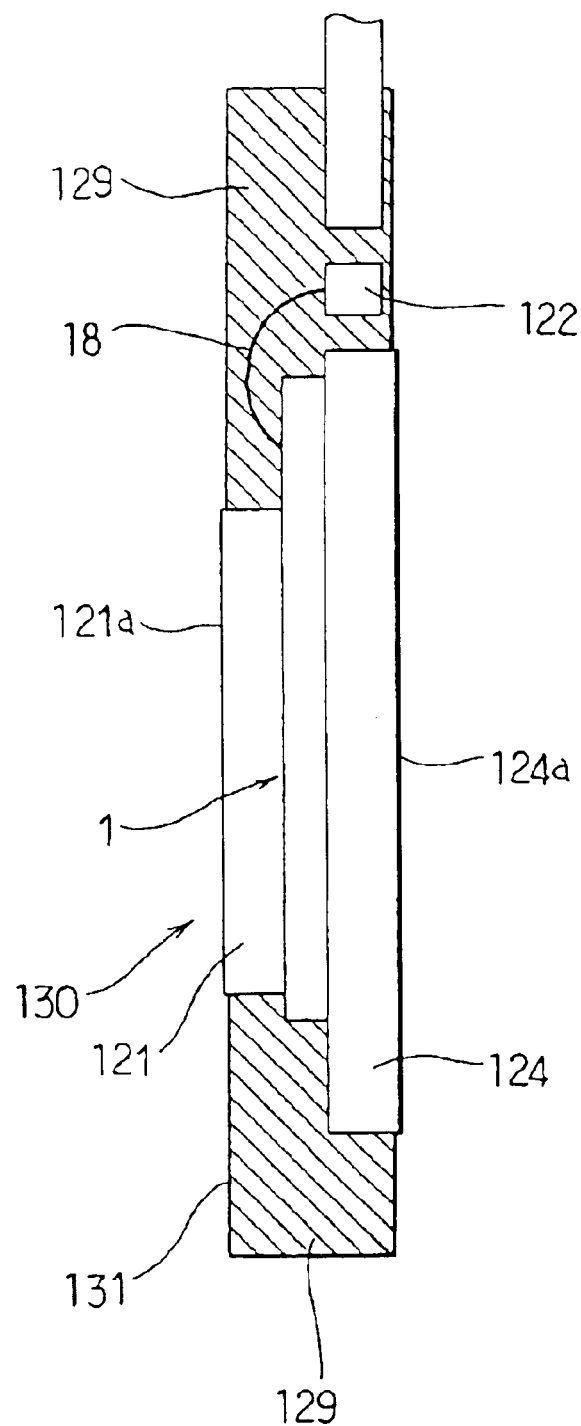
FIG. 26 is a cross-sectional view showing the IGBT molded with resin in the fifteenth embodiment.

Referring back to FIG. 2 explained in the first embodiment, each of the emitter pads 15 is connected, as shown by double-dotted lines in FIG. 2, with the plural emitter electrodes 10 in each cell block 12, so that it has a function as the aforementioned wiring layer 14. Each emitter pad 15 provides an electric conduction with chip outside and is connected in this embodiment with an emitter terminal 121 disposed outside of the chip 1, as shown in FIGS. 24, 26 and 27, by for example soldering.

Figure 27:
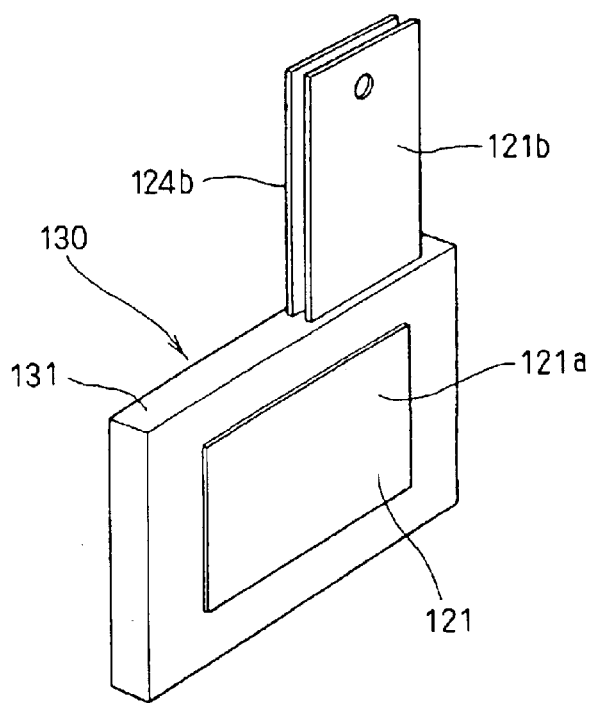
FIG. 27 is a perspective view showing the IGBT molded with resin in the fifteenth embodiment.

As shown in FIG. 27, the emitter terminal 121 is an external electrode (e.g., a lead frame) and is made of a generally L-shaped conductive sheet. Specifically, the emitter terminal 121 has a rectangular portion 121a and a rectangular extending portion 121b. In this embodiment, the emitter terminal 121 also has a function as a heat sink (i.e., a radiation sheet) to cool the chip 1 from its surface.

On the other hand, referring back again to FIG. 2, each of the gate pads 16 is connected with the gate electrodes 8 in each cell block 12 through the aforementioned wiring layer 13, as shown in FIG.2. In this case, the wiring layer 13 is transversely taken out and is arranged along the longitudinal side portion (i.e., in the portion between the two emitter pads 15), as shown in FIG.25, of the emitter pads 15 and is connected with each gate pad 16.

Figure 24:
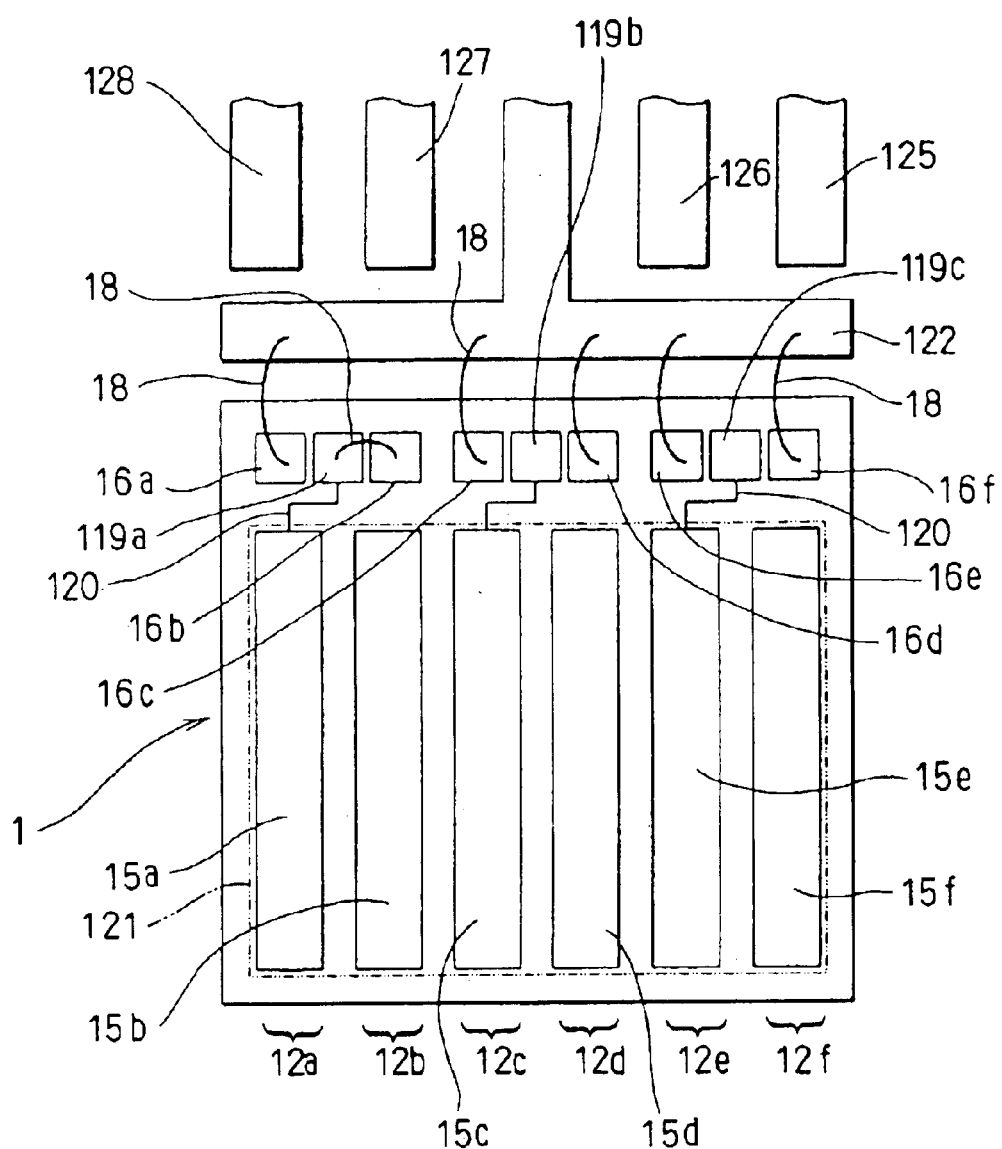
FIG. 24 is a plan view showing a state where an IGBT chip and a gate terminal of a lead frame are wire-bonded to each other in a fifteenth preferred embodiment.

As shown in FIG. 24, each of the gate pads 16 provides electric conduction to the outside of the IGBY chip 1 and is connected in this embodiment with a gate terminal 122 disposed outside of the chip 1 through bonding wires 18, for example. Here, the gate pads 16 connected with the gate terminal 122 are the gate pads 16 (e.g., the gate pads 16a, 16c to 16f) connected with the gate electrodes 8 of the non-defective cell blocks 12. Accordingly, when a gate controlling signal is fed from the outside to the gate terminal 122, it is fed to the gate electrodes 8 of the non-defective cell blocks 12 so that the elements in the non-defective cell blocks 12 are operated.

To the contrary, the gate pad 16 (e.g., the gate pad 16b), connected with the gate electrodes 18 of the defective cell block 12, is connected with the pad 119a having the emitter potential on the chip 1, as shown in FIG. 24, through for example the bonding wire 18. As a result, the gate electrodes 8 (the gate pad 16c) of the defective cell block 12 is fixed at the emitter potential (i.e.,the GND potential). Therefore, the gate controlling signal is not fed to the gate electrodes 18 of the defective cell block 12 so that the elements in the defective cell block 12 are not operated. Here, the gate terminal 122 is an external electrode made of for example a lead frame (a part of the lead frame).

On the other hand, the collector electrode 11, formed substantially all over the back face of the chip 1, has a function as a pad to take electric conduction to the outside of the chip 1. In this embodiment, as shown in FIGS. 26 and 27, the collector electrode 11 is connected, by for example soldering, with a collector terminal 124 disposed outside of the chip 1. As shown in FIG. 27, the collector terminal 124 is an external electrode (e.g., a lead frame) and is made of a generally L-shaped conductive sheet. Specifically, the collector terminal 124 has a rectangular portion 124a and a rectangular extending portion 124b. The collector terminal 124 also has a function as a heat sink (i.e., a radiation sheet), and cools the chip 1 from the back surface of the chip 1. In this embodiment, therefore, the chip 1 is cooled (or radiated) from the both surfaces thereof through the emitter terminal 121 and the collector terminal 124.

Incidentally, the chip 1 has a temperature sensor and a current sensor (although both are not shown) there in, and several controlling pads (not shown) connected with the sensors are formed on the surface of the chip 1. The controlling pads are provided for taking electric conduction with the outside of the chip 1 and as shown in FIG. 24, are connected with control terminals 125 to 128 disposed outside of the chip 1, by for example wire-bonding. The control terminals 125 to 128 are external electrodes made of, for example, the lead frame (parts of the lead frame).

As described above, the external terminals (the lead frame) are soldered to the chip 1 and wire-bonding is performed to the external terminals. After that, as shown in FIGS. 26 and 27, the chip 1 and the external terminals (the lead frame) are molded with resin 129. Thus, a resin-molded IGBT 130 is manufactured. In the case of the IGBT 130, the rectangular extending portions 121b and 124b of the emitter terminal 121 and the collector terminal 124 are so protruded upward from an upper end portion of a molded body 131 of the resin 129 as to confront each other.

In FIG. 27, the rectangular portion 121a of the emitter terminal 121 is exposed on the right side face of the molded body 131, while the rectangular portion 124a (as referred to FIG. 26) of the collector terminal 124 is exposed on the left side face of the molded body 131. In the molded body 131, a chip of a free wheel diode (not shown) is buried. The chip of the free wheel diode has an anode pad (electrode) that is soldered, for example, to the emitter terminal 121, and a cathode pad (electrode) that is soldered, for example, to the collector terminal 124.

Figure 28:
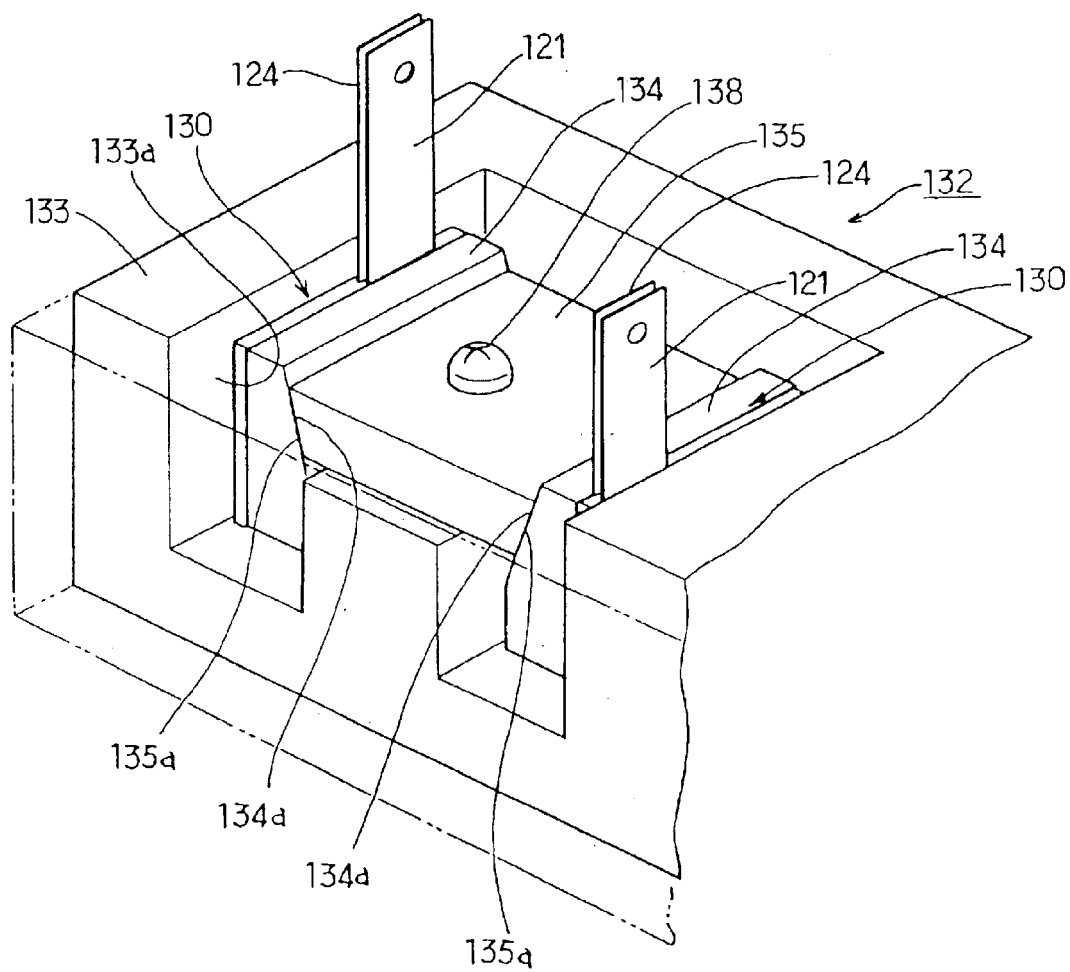
FIG. 28 is a perspective view partially showing an IGBT module in the fifteenth embodiment.
Figure 29:
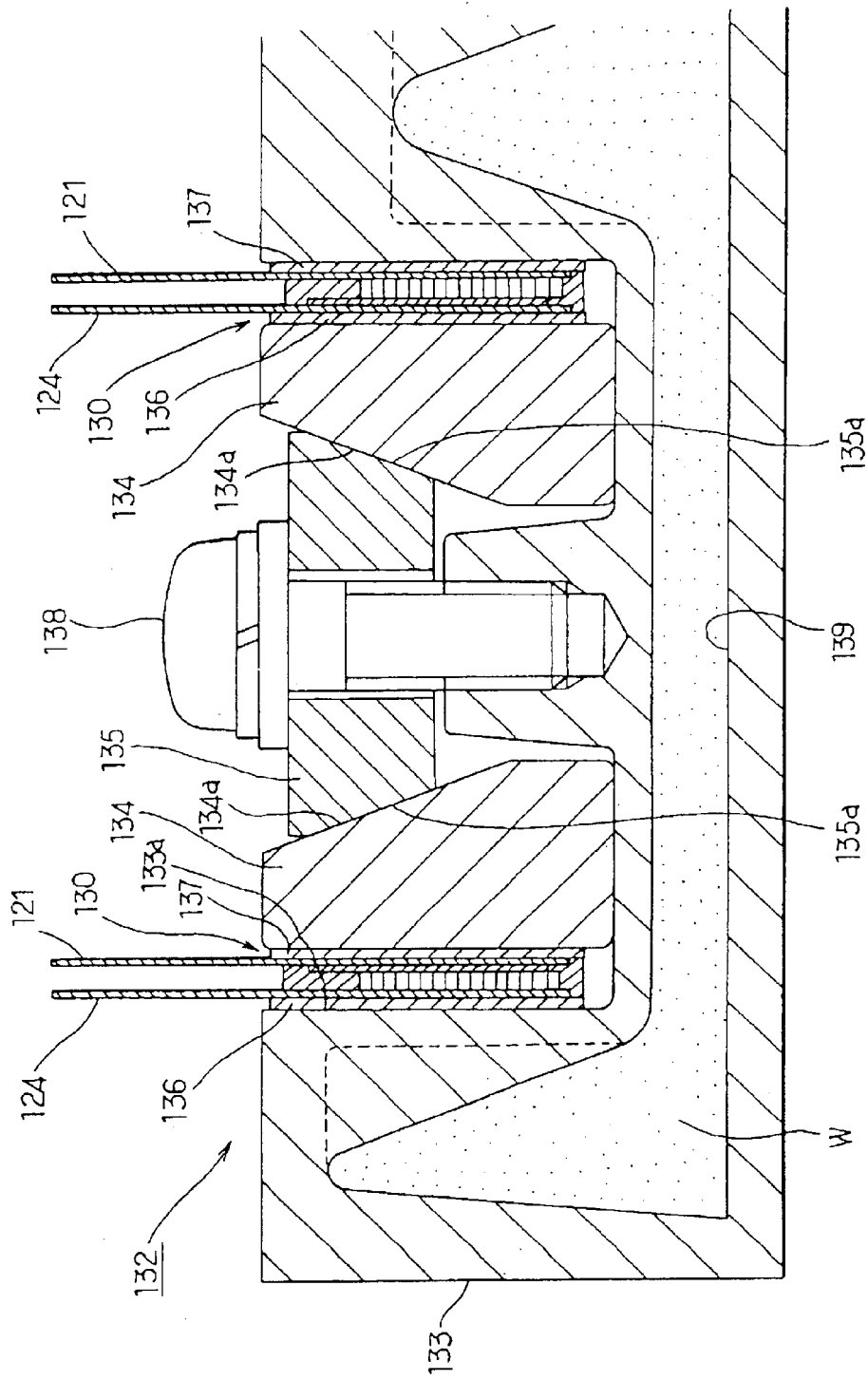
FIG. 29 is a cross-sectional view partially showing the IGBT module in the fifteenth embodiment.

Then, as shown in FIGS. 28 and 29, in this embodiment, six IGBTs 130 are employed to manufacture a 6-in-1 type IGBT module 132. The applicant of this invention has filed an application (JP-A-2000-91485) and proposed an embodiment in which a 6-in-1 type IGBT module (having substantially the same construction as that of the IGBT module 132 of this embodiment) is manufactured from six IGBTs having an appearing structure substantially the same as that of the IGBT 130. Therefore, the IGBT module 32 is explained briefly and its detailed explanation is omitted.

As shown in FIGS. 28 and 29, the IGBT module 132 has a cooling block 133, the IGBT 130 housed in an element housing portion 133a of the cooling block 133, and radiation blocks 134 and 135 for pushing the IGBT 130 into contact with the cooling block 133. Incidentally in FIGS. 28 and 29, only the two IGBTs 130 are shown while omitting the remaining four IGBTs 130. The construction for mounting the remaining four IGBTs 130 on the cooling block 133 is substantially the same as that for mounting the two IGBTs 130 on the cooling block 133 as show in the drawings.

In this construction, each of the IGBTs 130 is sandwiched between two insulating substrates 136 and 137. The insulating substrates 136 and 137 are highly thermally conductive substrates made of aluminum nitride or the like. The two insulating substrates 136 and 137 are for example fused or soldered to the emitter terminal 121 and the collector terminal 124. The gate terminal 122 of the IGBT 130 is for example fused or soldered to one of the insulating substrates 136 and 137, although not shown, so that it can be connected with the external terminal.

Each of the IGBTs 130 sandwiched between the insulating substrates 136 and 137 is housed to abut the inner side face of the element housing portion 133a of the cooling block 133 and is held in contact with the inner side face of the element housing portion 133a under pressure by the radiation blocks 134 and 135 pushing it. This contacting state under pressure is kept by fastening and fixing the radiation block 135 to the cooling block 133 by a screw 138.

The radiation blocks 134 and 135 are made of a material such as aluminum having superior thermal conductivity. The radiation block 134 is given a sectional shape having a slope 134a in a portion of a rectangle. The radiation block 135 is given a generally trapezoidal section having slopes 135a, 135a. The radiation block 135 has a through hole for receiving the screw 138 therein. In this construction, as the radiation block 135 is moved downward in FIG. 29 by fastening the screw 138, the slopes 135a of the radiation block 135 abut and push the slopes 134aof the two radiation blocks 134 so that the two radiation blocks 134 are pushed transversely in FIG. 29. Accordingly, the two IGBTs 130 are urged against the inner side faces of the element housing portion 133a of the cooling block 133.

On the other hand, the cooling block 133 is also made of a material such as aluminum having superior thermal conductivity. The cooling block 133 is provided with three element housing portions 133a each for housing two IGBTs 130 so that it can house fixedly the totally six IGBTs 130. Further, a refrigerant passage 139 for passing refrigerant W such as water is formed in the cooling block 133. In this case, the refrigerant W can be supplied from the outside to the inside of the refrigerant passage 139, and the refrigerant W having flown in the refrigerant passage 139 can be extracted to the outside. Thus, the cooling block 133, i.e., the IGBTs 130 can be cooled sufficiently.

Next, the process for manufacturing the chips 1 of the IGBTs 130 thus constructed will be explained briefly. The semiconductor wafer process, the electric testing step by the TEGWAT and the WAT, and the dicing step are substantially the same as those explained in the fourth embodiment, so that their description will be omitted from this embodiment. It is apparent that the methods for discriminating the non-defective and defective cell blocks and the methods for sorting the same as described in the aforementioned embodiments can be applied to this embodiment.

In this embodiment, after the dicing step is carried out, a step of connecting the chips 1 to the external electrodes (the lead frame or the like) is carried out, which will be specifically described below.

First, the emitter terminal 121 for the heat sink is soldered to the emitter pads 15 of the chip 1, and the collector terminal 124 for the heat sink is soldered to the collector electrode 11 of the chip 1. After that, on the basis of the aforementioned quality test results, the gate pads 16 (16a and 16c to 16f), connected with the gate electrodes 8 of the non-defective cell blocks 12, are connected with the gate terminal 122 of the lead frame outside of the chip 1 by wire-bonding. Further, the gate pad 16 (16b), connected with the gate electrodes 8 of the defective cell block 12, is connected with the pad 119a having the emitter potential on the chip 1, by wire-bonding. After the soldering and the wire-bonding steps are finished, then as shown in FIGS. 26 and 27, a step of molding the chip 1 and the external terminals (the lead frame) with the resin 129. As a result, the IGBT 130 molded with the resin 129 is manufactured.

Next, as shown in FIGS. 28 and 29, the 6-in-1 type IGBT module 132 is manufactured from six IGBTs 130. First, each of the IGBTs 130 is sandwiched between the two insulating substrates 136 and 137. In this case, the two insulating substrates 136 and 137 are fused or soldered to the two surfaces of the IGBT 130. Successively, the IGBT 130 sandwiched between the insulating substrates 136 and 137 is housed in abutment against the inner side faces of the element housing portion 133a of the cooling block 133 and is pushed by the radiation blocks 134 and 135. In this case, the IGBT 130 is pushed to abut against the inner side faces of the element housing portion 133a of the cooling block 133 and held in the abutting state by fixing the radiation block 135 to the cooling block 133 by fastening the screw 138. Thus, the assembling of the IGBT module 132 is complted.

According to this embodiment thus constructed, it is possible to achieve the effects similar to those of the aforementioned embodiments. For example,the several cell blocks 12 are formed on the surface of the chip 1 (the semiconductor substrate) of one IGBT, to have the gate electrodes 8 electrically independent among those of the respective cell blocks 12, and the gate pads 16 are provided to be connected with the respective gate electrodes 8 of the respective cell blocks 12. Accordingly, the qualities of the cell blocks 12 can be easily determined by the well-known test device Further, in this construction, only the gate pads 16 of the non-defective cell blocks 12 can be connected with the external gate terminal 122. Therefore, even when some of the cell blocks 12 is defective, the IGBT (the insulated gate power IC) can be constructed exclusively of the non-defective cell blocks 12 so that it can normally be operated. As a result, the rate of non-defective products can be prevented from dropping, even when the chip size of the IGBT is enlarged.

In the case of the aforementioned construction, moreover, because a multi-layered wiring construction is not required, the number of steps of the semiconductor wafer process is not increased. This is because it is easily realized by changing the pattern design of the photo mask to provide the gate pad 16 for each cell block 12. As a result, even when the chip size of the IGBT is enlarged, the rate of non-defective products can be prevented from dropping (that is, the production yield can be improved), and the semiconductor wafer process can be prevented from being complicated, unlike the construction proposed in JP-A-8-191145.

In this embodiment, because the several pads 119 having the emitter potential are formed on the surface of the chip 1 to be adjacent to the gate pads 16, the gate pad 16 connected with the gate electrodes 8 of the defective cell block 12 can be connected with the pad 119 by wire-bonding readily. As a result, the lead frame needs not be provided with the ground terminal so that the working of the lead frame is simplified to reduce the production cost accordingly. It is also possible to prevent the package size from becoming large and to prevent the bonding wires from contacting one another.

Further in this embodiment, because the pads 119 having the emitter potential are arranged adjacent to the gate pads 16, even when the gate pad 16 of the defective cell block is wire-bonded to one of the pads 119 having the emitter potential, the emitter terminal 121 for the heat sink can be soldered to the surface of the chip 1. As a result, the chip 1 of the IGBT 130 can be applied to the device having the structure which is cooled from the surface of the chip.

In this embodiment, moreover, the emitter terminal 121 for the heat sink is soldered to the emitter pads 15 on the surface of the chip 1, and the collector terminal 124 for the heat sink is soldered to the collector electrode 11 on the back surface of the chip 1. Therefore, the chip 1 can be smoothly cooled from the both surfaces thereof through the emitter terminal 121 and collector terminal 124.

Sixteenth Embodiment

Figure 30:
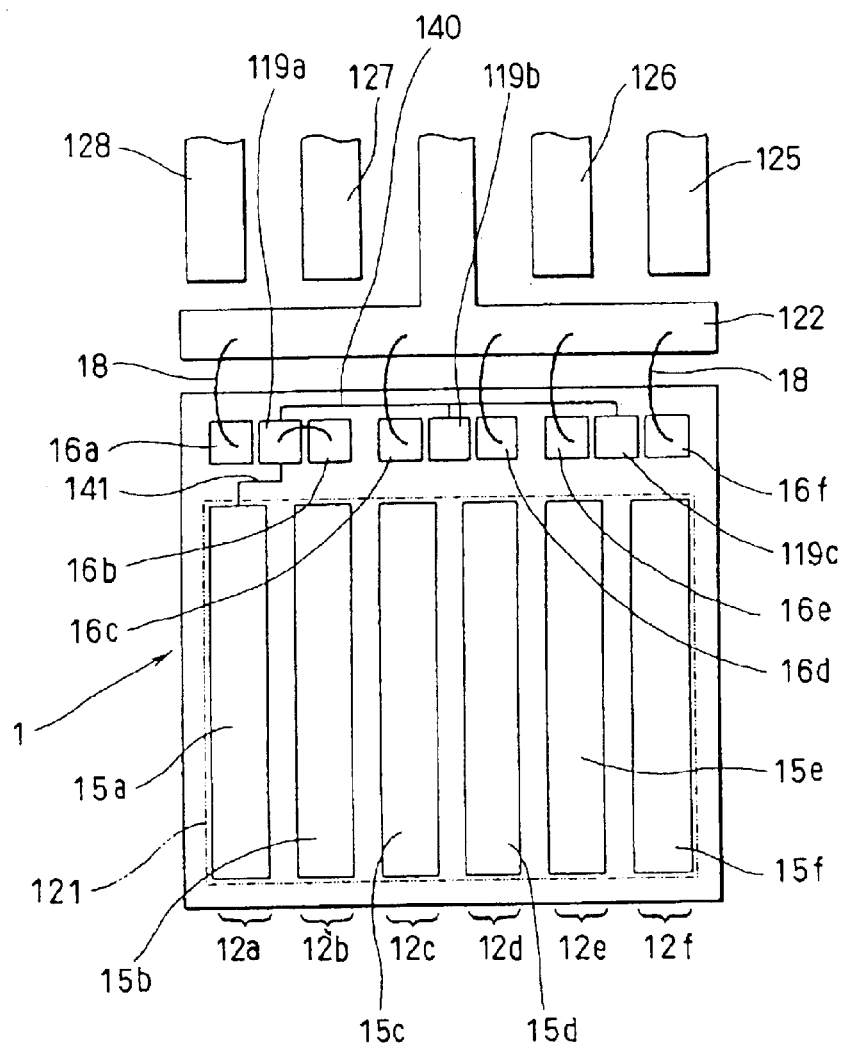
FIG. 30 is a plan view showing a state where an IGBT chip and a gate terminal of a lead frame are wire-bonded to each other in a sixteenth preferred embodiment.

FIG. 30 shows a sixteenth preferred embodiment of the present invention, in which the same parts as those in the fifteenth embodiment are designated by the same reference numerals. In the sixteenth embodiment, when the pads 119 having the emitter potential are to be connected with the emitter pads 15, the pads 119a to 119c having different emitter potentials are connected with each other through wiring members 140, and the pad 119a, located at the left side end in FIG. 30 is connected with the left side end emitter pad 15a through a wiring member 141.

The other constructions of the sixteenth embodiment than the aforementioned one are substantially the same as those of the fifteenth embodiment. In the sixteenth embodiment, therefore, it is possible to achieve the same effects as those of the fifteenth embodiment.

Seventeenth Embodiment

Here will be described a seventeenth preferred embodiment of the present invention. In the seventeenth embodiment, the gate pads 16, connected with the gate electrodes of the cell blocks 12 having an equal threshold voltage Vth, are connected with the external gate terminal 122, and the gate pads 16, connected with the gate electrodes of the cell blocks 12 having different threshold voltages Vth, are connected with the pads 119 having the emitter potential.

Specifically, after the semiconductor wafer process of the IGBT chip 1 is finished, at the step of electrically testing the respective chips 1 on the wafer, the threshold voltages Vth of all the cell blocks 12 in each chip 1 are measured. Here, the construction of the chip 1 having undergone the semiconductor wafer process may be the same as that of the chip 1 of the sixteenth embodiment.

When the threshold voltages Vth of the cell blocks 12 are to be measured, that is, for example when the threshold voltage Vth of the cell block 12a at the left side end in FIG. 30 is to be measured, the gate pads 16b to 16f are fixed at the emitter potential, and a gate bias is applied to only the gate pad 16a. From now on, it is arbitrary to measure the threshold voltages Vth of every cell block 12 likewise.

Here it is assumed that the threshold voltage Vth of the cell block 12b is lower than those of others, namely, that a cell region having a lower threshold voltage vth locally exists in the cell block 12b. With this assumption, the measurement result of the threshold voltage vth of the cell blocks 12 other than the cell block 12b is as illustrated in FIG. 31A, and the measurement result of the threshold voltage vth of the cell block 12b is as illustrated in FIG. 31B.

Figure 31A:
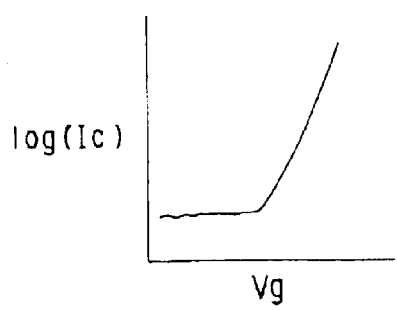
FIGS. 31A and 31B are graphs showing relations of cell blocks between gate bias Vg and collector current Ic in a seventeenth embodiment.
Figure 31B:
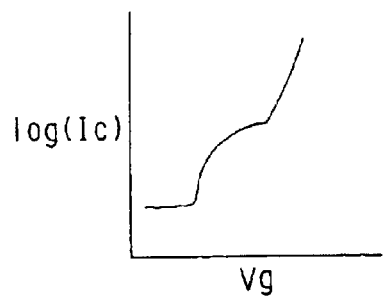

In FIGS. 31A and 31B, the abscissa indicates a gate bias (voltage) Vg, and the ordinate indicates the logarithmic value of a collector current Ic. In this case, it is found that the threshold voltage Vth in FIG. 31B is lower than in FIG. 31A. In this case, if all (six) cell blocks 12 (including the cell block 12b having the lower threshold voltage Vth) in the chip 1 are operated, current would be concentrated at a switching time of a high current on the cell block 12b having the lower threshold voltage Vth, thereby to cause a deficiency that the breakdown withstand capability of the chip 1 drops.

In the seventeenth embodiment, therefore, the construction is made such that the cell block 12b having the lower threshold voltage Vth is not operated. Specifically, the gate pads 16 (16a and 16c to 16f), connected with the gate electrodes 8 of the cell blocks 12 having an approximately equal threshold voltage Vth, are connected with the gate terminal 122 of the lead frame outside of the chip 1 by wire-bonding. At the same time, the gate pad 16 (16b), connected with the gate electrodes 8 of the cell block 12b having the lower (different) threshold voltage Vth, is connected with the pad 119a having the emitter potential on the chip 1 by wire-bonding.

With these connections, the cell block 12b having the lower threshold voltage Vth is not operated, and the cell region locally having the lower threshold voltage Vth in that cell block 12b is kept at an OFF state. At the switching time of large current, therefore, current is not concentrated in the cell block 12b having the lower threshold voltage Vth, and the breakdown withstand capability of the chip 1 can be prevented from dropping. The other constructions of the seventeenth embodiment than the aforementioned one are substantially the same as those of the fifteenth or sixteenth embodiment, and therefore, substantially the same effects as in the fifteenth and sixteenth embodiments can be attained in the seventeenth embodiment.

The present invention may be constructed by combining the seventeenth embodiment with the fifteenth or sixteenth embodiment, or other aforementioned embodiments. Specifically, the gate pads 16, connected with the gate electrodes of the non-defective cell blocks 12, and the gate pads 16 and connected with the gate electrodes of the cell blocks 12 having an equal threshold voltage Vth, may be connected with the external gate terminal 122. In this case, the gate pad 16, connected with the gate electrodes of the defective cell block 12 and connected with the gate electrodes of the cell blocks 12 having different threshold voltage Vth, are connected with the pads 119 having the emitter potential.

Here in the aforementioned respective embodiments, although the pads 119a to 119c having the emitter potential are provided on the surface of the chip 1 alternately between the gate pads 16a to 16f, the present invention should not be limited this. For example, the pads 119a to 119c may be respectively arranged between the gate pads 16a to 16f or at suitable portions around the gate pads 16a to 16f. Further, it is possible to modify the size and the shape of the pads 119 having the emitter potential suitably.

In the aforementioned respective embodiments, the emitter terminal 121 for the heat sink is soldered to the emitter pads of the chip 1. Alternatively, the emitter pads 15 may be wire-bonded to the emitter terminal constituting a lead frame. In the aforementioned respective embodiments, the 6-in-1 type IGBT module 132 is manufactured by using six IGBTs 130. However, the present invention should not be limited to this but may be applied to manufacture a 2-in-1 type IGBT module, a 7-in-1 type IGBT module, an IGBT discrete package or the like.

In the aforementioned respective embodiments, the plurality of gate pads 16 are arranged on one side portion of the surface of the IGBT chip 1. However, the present invention should not be limited to this but can be modified such that the arrangements of the gate pads 16 are designed to correspond to the connection form with the external gate terminal 122. In the aforementioned respective embodiments, the present invention is applied to the n-channel type IGBT but may be applied to a p-channel type.

In the aforementioned embodiments, the present invention is applied to the IGBT. However, the present invention should not be limited to this but may be applied to an insulated gate type power IC equipped with a gate electrode for controlling current on a semiconductor substrate, such as a MOSFET or a MOS type field effect element. When the present invention is applied to the MOSFET, the emitter pads 15 in the aforementioned embodiments would be replaced with source pads.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate;
   a plurality of cell blocks provided on the semiconductor substrate, wherein each cell block includes a plurality of transistor cells;
   a plurality of gate electrodes formed in each of the plurality of cell blocks, wherein the plurality of gate electrodes of one cell block are electrically independent of the plurality of gate electrodes of other cell blocks; and
   a plurality of gate pads provided on the semiconductor substrate corresponding to the plurality of cell blocks, wherein each of the plurality of gate pads is connected to one of the plurality of gate electrodes of the corresponding cell block.

2. The semiconductor device according to claim 1, wherein:
   the semiconductor substrate has a rectangular shape; and
   the plurality of gate pads are arranged along a side of the semiconductor substrate.

3. The semiconductor device according to claim 1, further comprising:
   a ground terminal provided outside of the semiconductor substrate; and
   a gate terminal provided outside of the semiconductor substrate, the gate terminal being electrically independent of the ground terminal, wherein:
   the plurality of cell blocks includes a first non-defective cell block and a second defective cell block; and
   the plurality of gate pads includes a first gate pad that connects the first non-defective cell block to the gate terminal, and a second gate pad that connects the second defective cell block to the ground terminal.

4. The semiconductor device according to claim 3, wherein:
   the first gate pad is bonded to the gate terminal by one of wire-bonding, soldering, and pressure-welding; and
   the second gate pad is bonded to the ground terminal by one of wire-bonding, soldering, and pressure-welding.

5. The semiconductor device according to claim 1, further comprising:
   a gate terminal provided outside of the semiconductor substrate;
   a source or emitter pad provided on the semiconductor substrate, wherein the source or emitter pad has a source potential or an emitter potential, wherein:
   the plurality of cell blocks includes a first non-defective cell block and a second defective cell block; and
   the plurality of gate pads includes a first gate pad that connects the first non-defective cell block to the gate terminal, and a second gate pad that connects the second defective cell block to the emitter or source pad.

6. The semiconductor device according to claim 5, wherein:
   the first gate pad is bonded to the gate terminal by one of wire-bonding, soldering, and pressure-welding; and
   the second gate pad is bonded to the source or emitter pad by one of wire-bonding, soldering, and pressure-welding.

7. The semiconductor device according to claim 1, wherein the semiconductor substrate is an insulated gate type bipolar transistor chip.

8. The semiconductor device according to claim 1, further comprising a plurality of marks provided at a plurality of regions of the semiconductor substrate, wherein the plurality of marks respectively corresponds to the plurality of cell blocks, each of the plurality of marks being for discriminating whether a corresponding cell block is defective.

9. The semiconductor device according to claim 8, wherein discrimination of whether each of the plurality of cell blocks is defective is determined by at least one of location, color, size, and shape of a corresponding one of the plurality of marks.

10. The semiconductor device according to claim 8, wherein discrimination of whether each of the plurality of cell blocks is defective is determined by a number of the plurality of marks corresponding to each of the plurality of cell blocks.

11. The semiconductor device according to claim 8, wherein:
    the plurality of cell blocks includes a first cell block;
    the plurality of gate pads includes a first gate pad connected with the first cell block; and
    the plurality of marks includes a first mark for discriminating whether the first cell block is defective, the first mark being provided on a line passing through the first gate pad.

12. The semiconductor device according to claim 11, wherein the first mark is provided at a side of the first gate pad opposite to the first cell block.

13. The semiconductor device according to claim 11, wherein:
    the plurality of cell blocks includes a second cell block;
    the plurality of gate pads includes a second gate pad connected with the second cell block;
    the plurality of marks includes a second mark for discriminating whether the second cell block is defective, the second mark being located apart from a line passing through a center of the second gate pad.

14. The semiconductor device according to claim 8, wherein each of the plurality of marks is located in a vicinity of a corresponding gate pad or on a surface of the corresponding gate pad.

15. The semiconductor device according to claim 8, wherein the plurality of marks can be recognized by an image recognition device of a wire-bonding apparatus.

16. The semiconductor device according to claim 1, further comprising a plurality of pads having an emitter potential and provided on the semiconductor substrate adjacent to the plurality of gate pads.

17. The semiconductor device according to claim 16, further comprising a gate terminal provided outside of the semiconductor substrate, wherein:
    the plurality of cell blocks includes a first cell block and a second cell block, the first cell block being non-defective and connected with the gate terminal and the second cell block being defective and connected with one of the plurality of pads having an emitter potential.

18. The semiconductor device according to claim 17, further comprising:
    a plurality of emitter electrodes respectively provided in the plurality of cell blocks;
    a plurality of emitter pads provided on a main surface of the semiconductor substrate and respectively connected with the plurality of emitter electrodes;
    a collector electrode provided on a back surface of the semiconductor substrate;
    an emitter terminal bonded to the main surface of the semiconductor substrate and electrically connected with the plurality of emitter pads;
    a collector terminal bonded to the back surface of the semiconductor substrate and electrically connected with the collector electrode; and
    a resin member encapsulating the gate terminal, the emitter terminal, and the collector terminal together.

19. The semiconductor device according to claim 17, further comprising:
    a plurality of emitter electrodes respectively provided in the plurality of cell blocks;
    a plurality of emitter pads provided on a main surface of the semiconductor substrate and respectively connected with the plurality of emitter electrodes; and
    an emitter terminal provided outside of the semiconductor substrate and electrically connected with the emitter pads, wherein:
        the first cell block is connected to the gate pad through a first bonding wire; and
        the second cell block is connected to the one of the plurality of pads through a second bonding wire.

20. The semiconductor device according to claim 16, further comprising a gate terminal provided outside of the semiconductor device, wherein:
    the plurality of cell blocks includes a first group of cell blocks, which have an equal threshold voltage and are connected with the gate terminal, and a second group of cell blocks, which have different threshold voltages from one another and are connected with one of the plurality of pads.

21. An apparatus for manufacturing an insulated gate type power IC, comprising:
    a chip transfer machine including a plurality of t rays for selectively holding a plurality of chips, wherein each chip includes:
        a semiconductor substrate;
        a plurality of cell blocks on the substrate, wherein each cell block includes a plurality of transistor cells;
        a plurality of gate electrodes formed in each of the plurality of cell blocks, wherein the plurality of gate electrodes of one cell block is electrically independent of the plurality of gate electrodes of others of the plurality of cell blocks; and
        a plurality of gate pads on the substrate and respectively corresponding to the plurality of cell blocks, wherein each gate pad is connected to the plurality of gate electrodes of a corresponding cell block; wherein:
            the plurality of chips is sorted based on an arrangement position of a defective cell block of each chip in one of the plurality of trays;
            the defective cell block has a corresponding gate pad that is connected with one of a ground terminal having a ground potential and an emitter pad having an emitter potential; and
            a non-defective cell block of each of the plurality of chips has a corresponding gate pad that is connected with a gate terminal provided outside of the semiconductor or substrate.

22. An insulated gate type power IC module that includes a plurality of insulated gate type ICs, each of the insulated gate type ICs comprising:
    a semiconductor substrate;
    a plurality of cell blocks located on the substrate each of which includes a plurality of transistor cells;
    a plurality of gate electrodes formed in each of the cell blocks, wherein the plurality of gate electrodes of one cell block is electrically independent of the plurality of gate electrodes of others of the plurality of cell blocks; and
    a plurality of gate pads on the substrate corresponding to the plurality of cell blocks, wherein each of the plurality of gate pads is connected to the plurality of gate electrodes of a corresponding cell block; wherein:
        each of the insulated gate type ICs includes a defective cell block at an identical position and a non-defective cell block, the defective cell block having a corresponding gate electrode that is connected with one of a ground terminal provided outside of the semiconductor substrate and an emitter pad provided on the semiconductor substrate, the non-defective cell block having a corresponding gate electrode that is connected with a gate terminal provided outside of the semiconductor substrate; and
        the insulated gate type power IC module is composed exclusively of the plurality of insulated gate type ICs.

23. A semiconductor device comprising:
    a plurality of transistor cells arranged in a semiconductor chip and divided equally into a plurality of groups, wherein each of the plurality of transistor cells comprises a source electrode on a surface side of the semiconductor chip and a drain electrode on a back side of the semiconductor chip;
    a plurality of common gate electrodes for the plurality of groups, respectively;
    a plurality of gate pads for the plurality of common gate electrodes, respectively, wherein each of the plurality of gate pads is located on the surface side of the semiconductor chip;
    a gate terminal bonded to certain of the plurality of gate pads with wires;

a source terminal commonly soldered to the source electrode; and a drain terminal commonly soldered to the drain electrode.

24. The semiconductor device according to claim 23, further comprising a coating of resin encapsulating the semiconductor chip, the wires, part of the gate terminal, and part of the drain terminal.

25. A semiconductor device comprising:

a plurality of transistor cells arranged in a semiconductor chip and divided equally into a plurality of groups, wherein each of the plurality of transistor cells comprises a source electrode on a surface side of the semiconductor chip and a drain electrode on a back side of the semiconductor chip;

a plurality of common gate electrodes for the plurality of groups, respectively;

a plurality of gate pads for the plurality of common gate electrodes, respectively, wherein each of the plurality of gate pads is located on the surface side of the semiconductor chip;

an equipotential pad adjacent to the plurality of gate pads, wherein a source potential is applied to the equipotential pad;

a gate terminal bonded to certain of the plurality of gate pads with wires;

a source terminal commonly soldered to the source electrode; and a drain terminal commonly soldered to the drain electrode.

26. The semiconductor device according to claim 25, wherein the equipotential pad is provided for a gate pad corresponding to one of the plurality of groups including a possibly defective transistor cell to be bonded with a wire.

27. The semiconductor device according to claim 26, further comprising a coating of resin encapsulating the semiconductor chip, the wires, part of the gate terminal, and part of the drain terminal.

28. A semiconductor device comprising:

a plurality of transistor cells arranged in a semiconductor chip and divided equally into a plurality of groups, wherein each of the plurality of transistor cells comprises a source electrode on a surface side of the semiconductor chip and a drain electrode on a back side of the semiconductor chip;

a plurality of common gate electrodes for the plurality of groups, respectively;

a plurality of gate pads for the plurality of common gate electrodes, respectively, wherein each of the plurality of gate pads is located on the surface side of the semiconductor chip;

wherein the semiconductor device further comprises an equipotential pad adjacent to the plurality of gate pads, wherein a source potential is applied to the equipotential pad, and the equipotential pad is provided for one of the plurality of gate pads corresponding to one of the plurality of groups including a possibly defective transistor cell to be bonded with a wire.

29. A semiconductor device comprising:

a plurality of transistor cells arranged in a semiconductor chip and divided equally into a plurality of groups;

a plurality of common gate electrodes for the plurality of group, respectively;

a plurality of gate pads for the plurality of common gate electrodes, respectively; and means for preventing one of the plurality of groups that includes a possibly defective transistor cell from operating.

30. The semiconductor device according to claim 29, wherein the preventing means includes means for applying a ground potential or a source potential to a corresponding common gate electrode through a corresponding gate pad.

31. The semiconductor device according to claim 23, wherein the plurality of transistor cells forms an insulated gate bipolar transistor in which the source electrode serves as an emitter and the drain electrode serves as a collector.

32. The semiconductor device according to claim 25, wherein the plurality of transistor cells forms an insulated gate bipolar transistor in which the source electrode serves as an emitter and the drain electrode serves as a collector.

33. The semiconductor device according to claim 28, wherein the plurality of transistor cells forms an insulated gate bipolar transistor in which the source electrode serves as an emitter and the drain electrode serves as a collector.

34. The semiconductor according to claim 29 wherein:

each of the plurality of transistor cells comprises a source electrode on a surface side of the semiconductor chip and a drain electrode on a back side of the semiconductor chip, wherein each of the plurality of gate pads is located on the surface side of the semiconductor chip; and the plurality of transistor cells forms an insulated gate bipolar transistor in which the source electrode serves as an emitter and the drain electrode serves as a collector.

* * * * *